(12) United States Patent
Kitamura

(10) Patent No.: US 6,815,752 B2
(45) Date of Patent: Nov. 9, 2004

(54) SEMICONDUCTOR MEMORY DEVICE FOR INCREASING ACCESS SPEED THEREOF

(75) Inventor: Takuya Kitamura, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/068,893

(22) Filed: Feb. 11, 2002

(65) Prior Publication Data

US 2002/0113237 A1 Aug. 22, 2002

(30) Foreign Application Priority Data

Feb. 19, 2001 (JP) ......................................... 2001-042534
Nov. 2, 2001 (JP) ......................................... 2001-338404

(51) Int. Cl.[7] ......................................... H01L 21/8242
(52) U.S. Cl. .................................... 257/306; 257/310
(58) Field of Search ................................. 257/306, 310, 257/E27.088; 438/253, 599, 241, 656, FOR 196, FOR 89, FOR 352

(56) References Cited

U.S. PATENT DOCUMENTS

| | | | | |
|---|---|---|---|---|
| 5,952,687 A | * | 9/1999 | Kawakubo et al. | ......... 257/296 |
| 6,136,660 A | | 10/2000 | Shen et al. | |
| 6,265,260 B1 | * | 7/2001 | Alers et al. | ................. 438/240 |
| 6,399,399 B2 | * | 6/2002 | Yamamoto | ...................... 438/3 |
| 2001/0014498 A1 | * | 8/2001 | Amico et al. | ................ 438/243 |
| 2002/0000598 A1 | * | 1/2002 | Kang et al. | .................. 257/301 |
| 2002/0004278 A1 | * | 1/2002 | Gutsche | ...................... 438/396 |
| 2002/0025650 A1 | * | 2/2002 | Thakur et al. | .............. 438/398 |
| 2002/0058380 A1 | * | 5/2002 | Parekh et al. | ................ 438/253 |
| 2002/0079522 A1 | * | 6/2002 | Diodato et al. | ............. 257/296 |
| 2002/0079526 A1 | * | 6/2002 | Fukuda et al. | .............. 257/298 |

FOREIGN PATENT DOCUMENTS

| | | |
|---|---|---|
| JP | 11-214644 | 8/1999 |
| JP | 2000-114475 | 4/2000 |
| JP | 2000-156479 | 6/2000 |
| WO | WO 98/28795 | 7/1998 |

* cited by examiner

Primary Examiner—George Fourson
(74) Attorney, Agent, or Firm—Young & Thompson

(57) ABSTRACT

A semiconductor memory device including 1T-1C memory cells for increasing an access speed thereto. The semiconductor memory device is composed of a substrate, a MOS (metal oxide semiconductor) transistor formed in a surface portion of the substrate, an inter-level dielectric covering the MOS transistor, a capacitor element, and a contact formed through the inter-level dielectric. The contact electrically connects the capacitor element to the MOS transistor on a source thereof. The contact includes a metal portion formed of metal. The metal portion reduces the resistance of the contact, and thereby increases the access speed of the semiconductor memory device.

10 Claims, 29 Drawing Sheets

SEMICONDUCTOR MEMORY DEVICE FOR INCREASING ACCESS SPEED THEREOF

BACKGROUND OF THE INVENTION

1. Field of the Invention

The present invention is related to a semiconductor memory device such as a dynamic random access memory (DRAM). Especially, the present invention is related to a structure of the semiconductor memory device and a method of fabricating the same.

2. Description of the Related Art

A memory cell of a semiconductor memory device is often constituted by a capacitor and a MOS (Metal Oxide Semiconductor) transistor. Such a memory cell is called 1T-1C cell. A dynamic random access memory (DRAM) includes a memory cell array in which 1T-1C cells are arranged in rows and columns.

FIG. 1 shows 1T-1C memory cells included in a conventional semiconductor memory device. The conventional semiconductor memory device is provided with MOS transistors formed in a surface portion of a P-type silicon substrate 100. The MOS transistors include gate oxide films 110, gate electrodes 103, N-type source regions 113, N-type drain region 114, LDD (lightly doped drain) regions 111, and sidewalls 112. The gate electrodes 103 function as word lines of the memory device. To reduce the contact resistance, a cobalt silicide technique is adapted to the memory device. Cobalt silicide layers 132 are formed in the surface portion of the source regions 113, and another cobalt silicide layers 132' is formed in the surface portion of the drain region 114. In addition, still another cobalt silicide layer 133 is formed in the surface portion of the gate electrodes 103. MOS transistors are electrically isolated from other elements (not shown) by STI (shallow trench isolation) dielectrics 101.

The MOS transistors and the STI dielectrics 101 are covered with a silicon nitride film 115 and an inter-level dielectric 116. The silicon nitride film 115 and the inter-level dielectric 116 are penetrated by capacitor plugs 104 formed of heavily doped polysilicon.

The inter-level dielectric 116 is covered with an inter-level dielectric 122. The inter-level dielectric 122 are provided with holes to accommodate the memory cell capacitors.

Each of the memory cell capacitors includes a bottom electrode 106, a dielectric layer 107, a titanium nitride layer 108, and a polysilicon layer 109. The bottom electrode 106 is formed of heavily doped polysilicon. The bottom electrode 106 is electrically connected to the source region 113 through the capacitor plug 104. The dielectric layer 107 is formed of tantalum oxide on the bottom electrode 106. The titanium nitride layer 108 and the polysilicon layer 109 functions as an upper electrode of the memory cell capacitor.

The inter-level dielectric 122 and the memory cell capacitors are covered with an inter-level dielectric 135. A bit line 131 formed of titanium nitride is formed on the inter-level dielectric 135.

A bit line contact plug 102 is formed through the inter-level dielectric 116, 122, and 135 to electrically connect the bit line 131 to the drain region 114 of the MOS transistors.

To access the memory cell, the bit line 131 is firstly set at a predetermined potential. Then, the gate electrode 103 is pulled up to activate the MOS transistor. The activation of the MOS transistor allows an exchange of charges between the bit line 131 and the memory cell capacitors through the bit line contact plugs 102, the MOS transistors and the capacitor plug 104, The exchange of the charges causes a change in the potential of the bit line 131. The potential of the bit line 131 is detected to define the data stored in the memory cell.

In the conventional memory device, the capacitor plugs 104, formed of doped polysilicon, increases the resistance between the bit line 131 and the bottom electrodes 106 of the memory cell capacitors. This decreases the access speed of the memory device. The resistance between the bit line 102 and the memory cell capacitors is desirably decreased.

In addition, the conventional memory device requires an etching technique to form a contact hole having a high aspect ratio. Before forming the bit line contact plug 102, a contact hole having a high aspect ration is necessary to be formed from the surface of the inter-level dielectric 135 to the drain region 114 of the MOS transistors. The necessity of forming a high-aspect-ratio contact hole makes the fabricating process difficult.

Yamanaka et al. disclose another semiconductor memory device for improving reliability and reducing a size of memory cells thereof in PCT Gazette (WO 09/28795). The semiconductor memory includes a memory cell region and a logical circuit region. The memory cell region includes a first transistor, and the logical circuit region includes second and third transistors that operate complementarily. The first, second and third transistors are covered with a dielectric. An interconnection of metal is formed on the dielectric over the memory cell region and the logical circuit region. Electrical connection between the interconnection and the first, second, and third transistor is achieved by a contact including a conductor formed in a hole fabricated through the dielectric. Yamanaka et al. discloses that the conductor included in the contact is formed of titanium nitride or titanium tungsten.

Shen et al. disclose still another semiconductor memory device for facilitating the fabrication process of a memory cell in U.S. Pat. No. 6,136,660 and Japanese Laid Open Patent Application (JP-A 2000-114475) corresponding thereto. The memory cell includes a field effect transistor and a stacked capacitor. The stacked capacitor has one plate formed by a platinum layer over the side walls of a portion of a dielectric layer that overlies a conductive layer that makes contact to a conductive plug connected to the storage node of the cell. The capacitor dielectric overlies the sidewalls and top of the dielectric layer portion and the other plate of the capacitor is formed by a platinum layer over the capacitor dielectric.

Ohno discloses still another semiconductor memory device having a cylindrical MIM (Metal Insulator Metal) structured capacitor for reducing junction leak, capacitance loss and reaction between silicon and electrode material in Japanese Laid Open Patent Application (JP-A 2000-156479). The memory device is provided with a semiconductor substrate on which an active element is formed. The semiconductor substrate is covered with an interlayer insulation film. A contact hole is formed through the interlayer insulation film to reach the active element. A plug made of conductive material is formed in the contact hole. A barrier layer is formed on the interlayer insulation film for covering at least an upper portion of the plug. A cylindrical bottom electrode is formed on the plug. A dielectric is formed on the bottom electrode, and an upper electrode is formed on the dielectric.

Saitoh et al. disclose still another semiconductor memory device having a COB (capacitor over bit line) structure for preventing defects in the fabrication process in Japanese Laid Open Patent Application (JP-A-Heisei 11-214644). The semiconductor memory device is provided with a first insulating film formed of silicon oxide on a semiconductor substrate. An interconnection is formed on the first insulating film. The interconnection is covered with a second insulating film. A memory cell capacitor including a high-∈ dielectric is formed on the second insulating film. The interconnection includes a conductive layer in contact with the first insulating film, the conductive layer being formed of refractory metal other than titanium, or refractory metal nitride.

SUMMARY OF THE INVENTION

An object of the present invention is to increase an access speed of a semiconductor memory by reducing a resistance between a bit line and memory cell capacitors.

Another object of the present invention is to facilitate the fabrication process of a semiconductor memory by avoid forming a contact hole having a high aspect ratio.

Still another object of the present invention is to improve reliability of a semiconductor device by preventing a short circuit between capacitor electrodes of memory cell capacitors.

In accordance with an aspect of the present invention, a semiconductor memory device is composed of a substrate, a MOS (metal oxide semiconductor) transistor formed in a surface portion of the substrate, a first inter-level dielectric covering the MOS transistor, a capacitor element, and a first contact formed through the first inter-level dielectric. The capacitor element includes a bottom electrode, a dielectric layer formed on the bottom electrode, and an upper electrode formed on the dielectric layer. The first contact electrically connects the bottom electrode to the source of the MOS transistor. The first contact includes a first metal portion formed of metal.

When the metal is refractory metal, the first contact preferably further includes a barrier layer formed between the source the MOS transistor and the first metal portion.

The refractory metal is preferably tungsten, and the contact barrier layer is preferably formed of titanium nitride.

The bottom electrode preferably includes a polysilicon layer connected to the dielectric layer, and an electrode barrier layer formed between the first metal portion and the polysilicon layer. In this case, the electrode barrier layer is preferably formed of titanium nitride.

The semiconductor memory device is preferably further composed of a second contact formed through the first inter-level dielectric to be connected to the drain of the MOS transistor, the second contact including a second metal portion formed of the same metal as the first metal portion.

When the metal used for the first and second metal portions is tungsten, the second contact preferably further includes a second barrier layer formed of titanium nitride between the drain of the MOS transistor and the second metal portion.

In this case, the semiconductor memory device is preferably further composed of a second inter-level dielectric covering the capacitor element and the first inter-level dielectric, a third contact formed through the second inter-level dielectric, and a bit line formed on the second inter-level dielectric, the second and third contact electrically connecting the drain of the MOS transistor to the bit line.

When the semiconductor memory device is further composed of another MOS transistor provided in a surface portion of the substrate for a peripheral circuit, the semiconductor memory device preferably composed o a fourth contact formed through the first inter-level dielectric to be connected to the other MOS transistor on a source/drain thereof, a fifth contact formed through the second inter-level dielectric to be connected to the fourth contact, the fourth contact including a third metal portion formed of the metal.

The bottom electrode is preferably composed of a polysilicon layer connected to the dielectric layer, and an electrode barrier layer formed between the first metal portion and the polysilicon layer.

In this case, the electrode barrier layer is preferably formed of titanium nitride.

When the semiconductor memory device is further composed of a second inter-level dielectric covering the first inter-level dielectric and a hole is formed through the second inter-level dielectric, it is preferable that the electrode barrier layer preferably includes a bottom barrier portion formed on the metal portion of the first contact, and a side barrier portion connected to the bottom barrier portion, the side barrier portion being formed on a side surface of the hole to extend towards an upper surface of the second inter-level dielectric, and that the polysilicon layer includes a bottom electrode portion formed on the bottom barrier portion, and a side electrode portion connected to the bottom electrode portion, the side electrode portion being formed on the side barrier portion, and that an end of the side electrode portion is substantially in alignment with the upper surface of the second inter-level dielectric, while an end of the side barrier portion is out of alignment with the upper surface of the second inter-level dielectric, the side barrier portion not reaching the upper surface of the second inter-level dielectric.

In accordance with another aspect of the present invention, a method of fabricating a semiconductor memory device is composed of:

providing a substrate;

forming a MOS transistor in a surface portion of the substrate, wherein the MOS transistor includes a gate, a source, and a drain;

forming a first inter-level dielectric to cover the MOS transistor;

forming a first contact through the first inter-level dielectric such that the first contact is connected to the source of the MOS transistor, wherein the first contact includes a first metal portion formed of metal;

forming a bottom electrode connected to the first contact;

forming a dielectric layer formed on the bottom electrode;

forming an upper electrode formed on the dielectric layer.

The method is preferably further composed of:

forming a second inter-level dielectric to cover the first inter-level dielectric and the first contact;

forming a hole through the second inter-level dielectric to expose the first contact, the forming the bottom electrode including:

depositing a conductive barrier material film on a side surface and bottom surface of the hole,
  depositing a polysilicon film on the conductive barrier material film,
  concurrently removing outside portions of the conductive barrier material film and the polysilicon film outside the hole to form the electrode barrier layer and the polysilicon layer, and
  selectively etching an end portion of the electrode barrier layer in the vicinity of an upper surface of the second inter-level dielectric such that an end of the conductive barrier material film does not reach the upper surface of the second inter-level dielectric, while the polysilicon layer is not etched.

In this case, the method is preferably further composed of:

forming a resist layer on the polysilicon film to plug the hole after the depositing the polysilicon film, wherein the layer is used as a mask for the concurrently etching; and removing the resist layer by a plasma process in an atmosphere including fluorocarbon, wherein the selectively etching is concurrently achieved during the removing the resist layer.

Also, the method is preferably further composed of:

forming an etching stopper layer to cover the first contact and the first inter-level dielectric;

forming a second inter-level dielectric on the etching stopper layer;

etching the second inter-level dielectric to expose a portion of the etching stopper layer, wherein the etching the second inter-level dielectric is stopped by the etching stopper layer;

etching the etching stopper layer to the first contact to form a hole penetrating the second inter-level dielectric and the etching stopper layer, wherein the bottom electrode, the dielectric layer, and the upper electrode are disposed inside the hole.

Moreover, the method is preferably further composed of:

forming a second contact formed through the first inter-level dielectric to be connected to the drain, the second contact including a second metal portion formed of the metal, wherein the first and second contacts are concurrently formed; and forming a bit line, wherein the bit line is electrically connected to the drain through the second contact.

In this case, the method is preferably further composed of:

forming another MOS transistor in a surface portion of the substrate for a peripheral circuit;

forming a third contact formed through the first inter-level dielectric to be connected to a source/drain region of the another MOS transistor, the third contact including a third metal portion formed of the metal, wherein the first, second and third contacts are concurrently formed; and forming an interconnection, wherein the interconnection is electrically connected to the source/drain region through the third contact.

BRIEF DESCRIPTION OF THE DRAWINGS

FIG. 22 is a schematic section showing capacitor plugs and a buried bit line plug formed in the contact holes;

FIG. 23 is a schematic section showing openings formed to accommodate the memory cell capacitors;

DESCRIPTION OF THE PREFERRED EMBODIMENTS

A semiconductor memory device according to the present invention will be described below in detail with reference to the attached drawings.

First Embodiment

Figure 2:
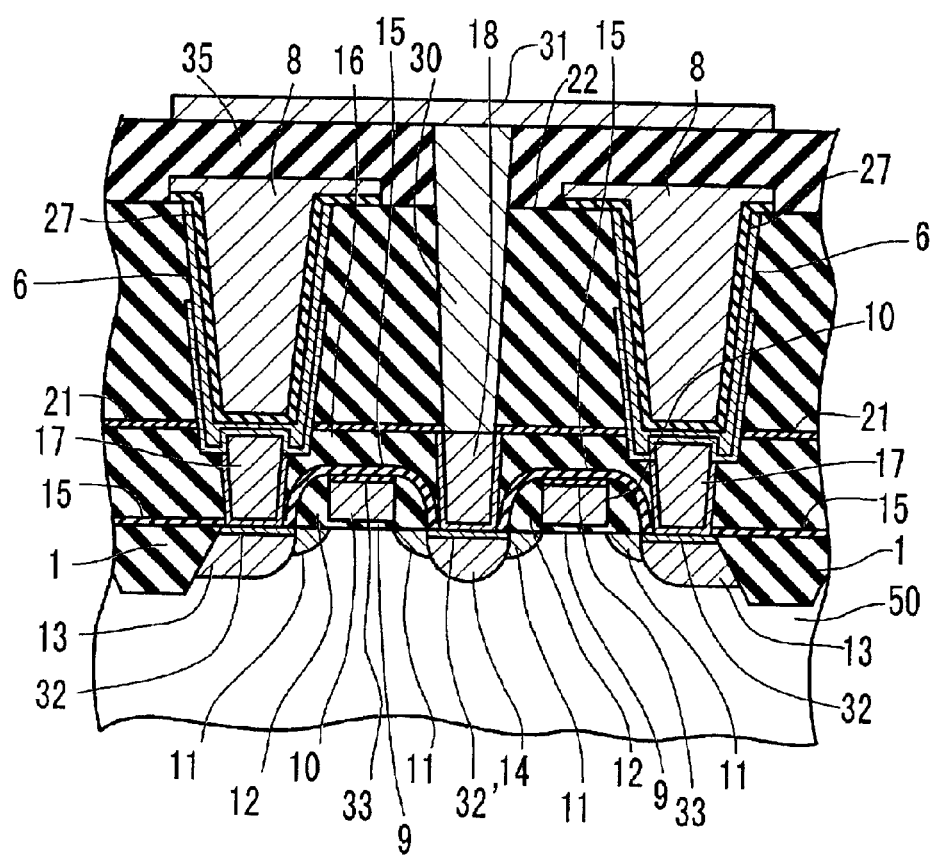
FIG. 2 schematically illustrates a section of a semiconductor memory device according to the present invention in a first embodiment.

As shown in FIG. 2, a semiconductor memory device is provided with memory cells respectively including a MOS transistor and a memory cell capacitor in a first embodiment. Two of the memory cells are shown in FIG. 2.

The MOS transistors, included in the memory cells, are formed in a surface region of the silicon substrate 50. In detail, STI dielectrics 1, LDDs 11, N-type source regions 13, and an N-type drain region 14 are formed in the surface portion of the silicon substrate 50. Gate dielectrics 9 are formed on the silicon substrate 50, and gate electrodes 10 are formed on the gate dielectrics 9. The gate electrodes 10 function as word lines of the memory device. Sidewalls 12 are formed on both sides of the gate electrodes 10, sidewalls 12 being located over the LDDs 11. A cobalt silicide technique is adapted to the memory device to reduce the contact resistance. The source regions 13 respectively have cobalt silicide layers 32 in the surface portions thereof, and the drain region 14 has a cobalt silicide layer 32' in the surface portion thereof. In addition, the gate electrodes 10 respectively have cobalt silicide layers 33 in the surface portion thereof. The gate electrodes 10, the LDDs 11, the source regions 13, and the drain region 14 constitute two MOS transistors. The MOS transistors are electrically isolated from other elements on the silicon substrate 50 by STI dielectrics 1.

Figure 3:
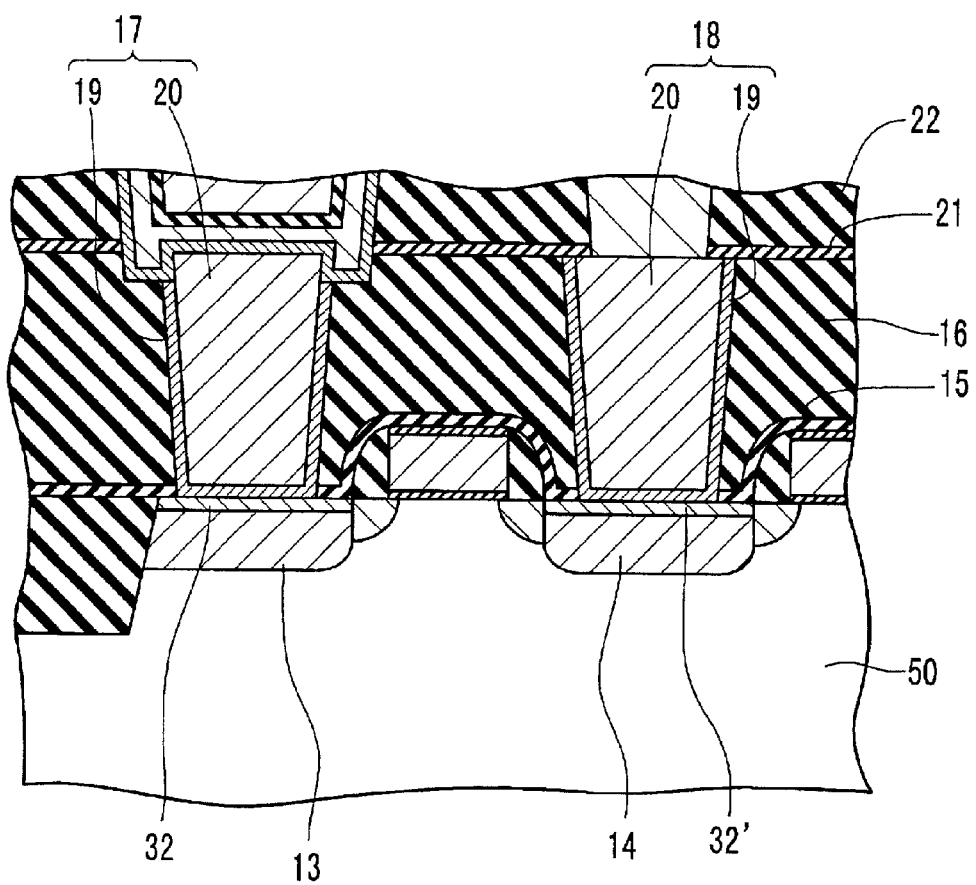
FIG. 3 is an enlarged schematic section of the semiconductor memory device in the first embodiment.

The MOS transistors are covered with a silicon nitride film 15 and an inter-level dielectric 16. The silicon nitride film 15 and the inter-level dielectric 16 are penetrated by capacitor plugs 17 and a buried bit line contact plug 18. As shown in FIG. 3, the capacitor plugs 17 and the buried bit line contact plug 18 are respectively formed of a barrier layer 19 and a metal layer 20 deposited inside the barrier layer 19. The barrier layer 19 is formed of titanium nitride, and the metal layer 20 is formed of refractory metal such as tungsten. The barrier layer 19 function as a diffusion barrier preventing reaction of the silicon of the silicon substrate 50 and the refractory metal of the metal layer 20. The use of the tungsten for the metal layer 20 is preferable due to its ease of deposition, good conformality, high conductivity, and high temperature stability. The metal layer 20, having high conductivity, decreases the resistance of the capacitor plugs 17, and thereby increases the access speed of the memory cell.

As shown in FIG. 2, the inter-level dielectric 16 is covered with a silicon oxynitride film 21 and an inter-level dielectric 22. The inter-level dielectric 22 is formed of silicon oxide deposited by a plasma CVD (chemical vapor deposition) method. The silicon oxynitride film 21 is an etching stopper for etching of the inter-level dielectric 22.

The memory cell capacitors are buried in the inter-level dielectric 22. The inter-level dielectric 22 has holes therein to accommodate the memory cell capacitors.

The memory cell capacitors respectively include a bottom electrode 6, a dielectric layer 27, and an upper electrode 8. The bottom electrode 6 is electrically connected to the source region 13 of the MOS transistor through the capacitor plug 17. All the upper electrodes 8 of the memory cell capacitors are electrically connected to each other to have the same potential. The upper electrodes 8 functions as plate lines of the memory device.

Figure 4:
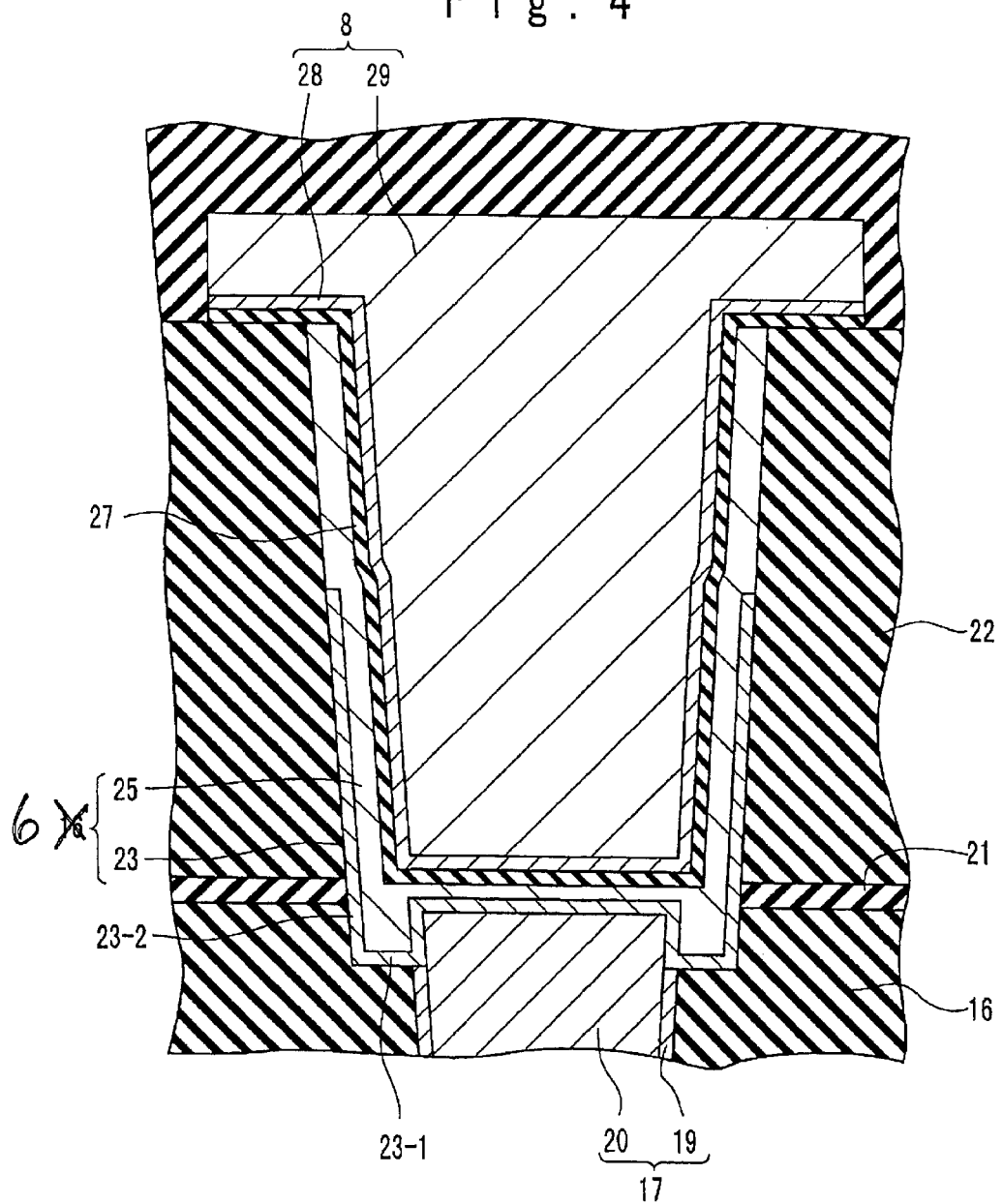
FIG. 4 is another enlarged schematic section of the semiconductor memory device in the first embodiment.

As shown in FIG. 4 the bottom electrode 6 includes a titanium nitride layer 23, and a doped polysilicon layer 25. The titanium nitride layer 23 is connected to the capacitor plug 17 on the metal layer 20.

The titanium nitride layer 23 prevents the diffusion of silicon from the doped polysilicon layer 25 to the metal layer 20 and also prevents the diffusion of the refractory metal from the metal layer 20 to the doped polysilicon layer 25. Also, the titanium nitride layer 23, having a large conductivity, reduces the resistance of the bottom electrode 6, and thereby increases the access speed of the memory cells.

The titanium nitride layer 23 includes a bottom portion 23-1 formed on the capacitor plug 17 and a side portion 23-2 formed on the side of the hole formed through the inter-level dielectric 22. The side portion 23-2 is connected to the bottom portion 23-1 and extends along the side of the hole toward the upper surface of the inter-level dielectric 22. The side portion 23-2 does not reach the upper surface of the inter-level dielectric 22, which implies that the end of the side portion 23-2 is not aligned to the upper surface of the inter-level dielectric 22.

The doped polysilicon layer 25 is deposited on the titanium nitride layer 23. The side portion of the doped polysilicon layer 25 extends along the hole formed through the inter-level dielectric 22, and the end of the doped polysilicon layer 25 is substantially aligned with the upper surface of the inter-level dielectric 22. The titanium nitride layer 23, which does not reach the upper surface of the inter-level dielectric 22, causes a slight step structure in the doped polysilicon layer 25.

The dielectric layer 27 is deposited on the doped polysilicon layer 25 of the bottom electrode 6. The dielectric layer 27 is formed of high dielectric constant material, preferably tantalum oxide. The dielectric layer 27 also has a slight step structure due to the slight step structure in the doped polysilicon layer 25.

The upper electrode 8, formed on the dielectric layer 27, includes a titanium nitride layer 28 and a doped polysilicon layer 29. The titanium nitride layer 28 is formed on the dielectric layer 27, and the doped polysilicon layer 29 is formed on the titanium nitride layer As shown in FIG. 2, the memory cell capacitors and the inter-level dielectric 22 are covered with the inter-level dielectric 35. A bit line 31 is formed on the inter-level dielectric 35. The inter-level dielectric 35 is penetrated by a bit line contact plug 30 formed of tungsten. The bit line contact plug 30 reaches the buried bit line contact plug 18. The buried bit line contact plug 18 and the bit line contact plug 30 electrically connect the bit line 31 to the drain region 14 of the MOS transistors.

Figure 5:
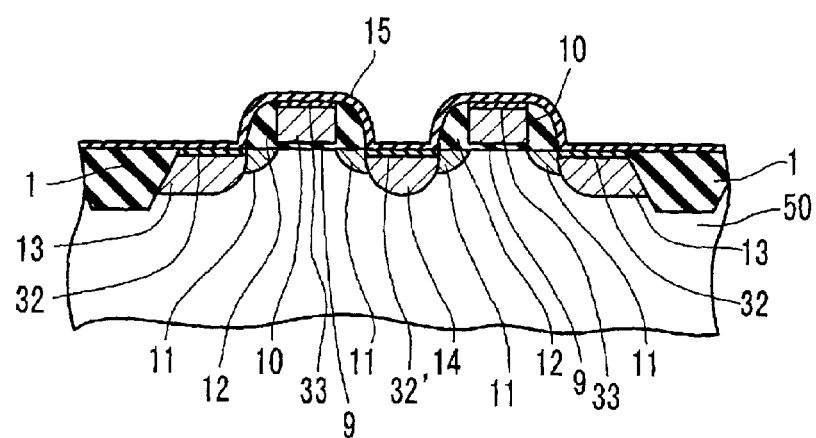
FIG. 5 is a schematic section showing the MOS transistor formed in a surface portion of a silicon substrate.

FIGS. 5 to 16 show the fabrication process of the memory device in the first embodiment. As shown in FIG. 5, the fabrication process begins with formation of the MOS transistors in the surface portion of the P-type silicon substrate 50. In detail, the STI dielectrics 1 having a thickness of 3500 Å is firstly formed in the surface portion of the P-type silicon substrate 50. Then, a well (not shown) is formed by an ion implantation technique in the surface portion of the P-type silicon substrate 50. After forming the gate dielectric 9, a heavily doped polysilicon layer is deposited on the gate dielectric 9. The gate dielectric 9 has a thickness of 70 Å and the heavily doped polysilicon layer has a thickness of 1500 Å. The heavily doped polysilicon layer is patterned through a photolithography and a plasma etching technique to form the gate electrodes 10. Then, N-type dopants are lightly implanted to form the LDD regions 11. After forming the sidewalls 12 on both sides of the gate electrodes 10, N-type dopants are heavily implanted to form the source regions 13 and the drain region 14. Next, cobalt silicide layers 32, 32' and 33 are respectively formed in the surface portions of the source regions 13, the drain region 14, and the gate electrodes 10 through a conventional cobalt silicide technique to complete the formation of the MOS transistors. Then, the MOS transistors are covered with the silicon nitride film 15.

Figure 6:
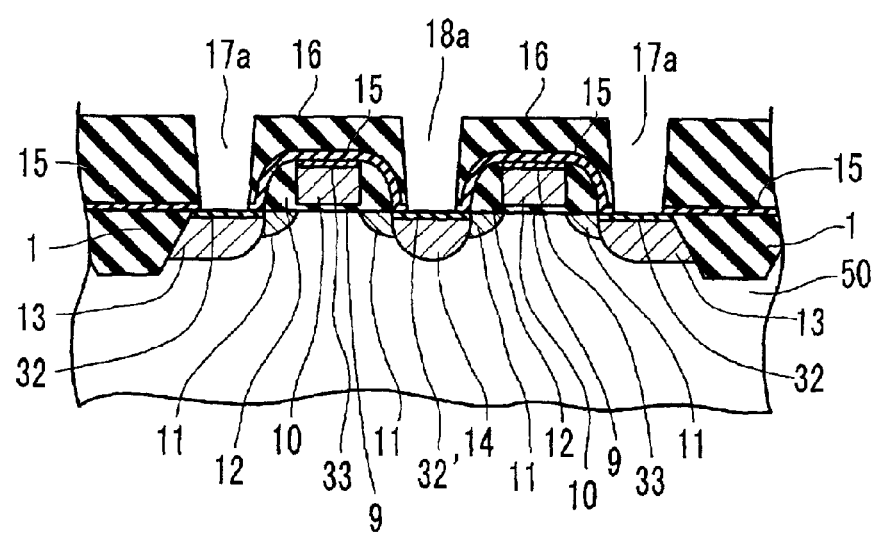
FIG. 6 is a schematic section showing contact holes formed through an inter-level dielectric covering the MOS transistor.

As shown in FIG. 6, a silicon oxide layer having a thickness of 6000 Å is deposited on the silicon nitride film 15 to form the inter-level dielectric 16. Then, contact holes 17a and 18a are formed through the inter-level dielectric 16 and the silicon nitride film 15. The contact holes 17a expose the source regions 13 and the contact hole 18a exposes the drain region 14.

Figure 7:
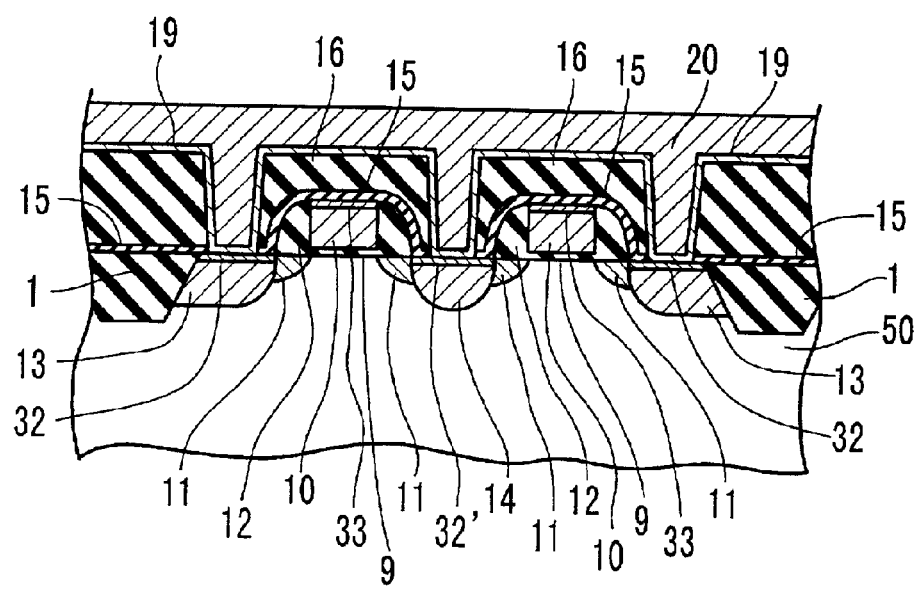
FIG. 7 is a schematic section showing a titanium nitride film and a refractory metal film deposited to plug the contact holes.

As shown in FIG. 7, a titanium nitride layer for the barrier layer 19 is deposited to cover the entire structure. Then, a refractory tungsten layer for the metal layer 20 is successively deposited on the barrier layer 19. The contact holes 17a and 18a are plugged with the barrier layer 19 and the metal layer 20.

Figure 8:
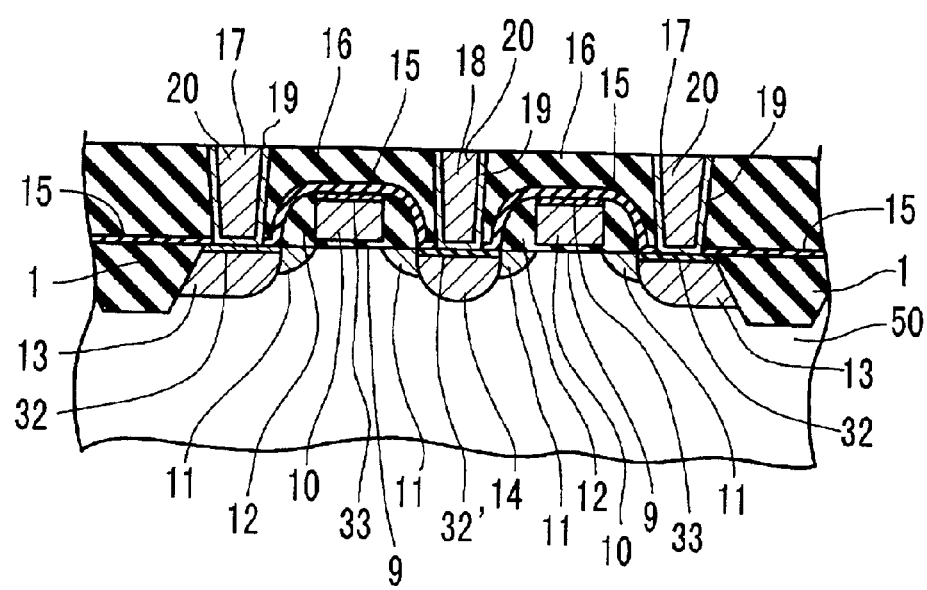
FIG. 8 is a schematic section showing capacitor plugs and a buried bit line contact plug formed in the contact holes.

As shown in FIG. 8, the upper surface portions of the barrier layer 19 and the metal layer 20 outside the contact holes 17a and 18a are removed by an etch back technique or a CMP (chemical mechanical polishing) technique. The removal of the outside portions of the barrier layer 19 and the metal layer 20 completes the capacitor plugs 17 and the buried bit line contact plug 18.

Figure 9:
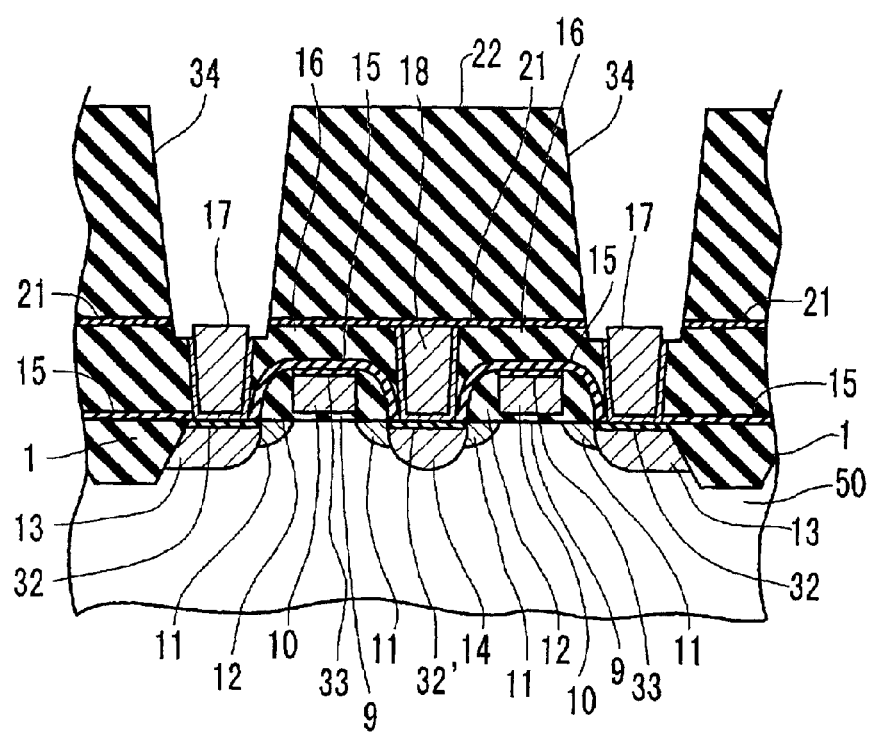
FIG. 9 is a schematic section showing openings formed to accommodate memory cell capacitors.

As shown in FIG. 9, the silicon oxinitride film 21 and the inter-level dielectric 22 are successively deposited on the entire structure. The silicon oxinitride film 21 has a thickness of 500 Å and the inter-level dielectric 22 has a thickness of 10000 Å. The inter-level dielectric 22 is then etched to form openings 34 through a photolithography and a dry etching technique. The etching of the inter-level dielectric 22 is temporarily stopped on the surface of the silicon oxinitride film 21. Then, the silicon oxinitride film 21 and the upper surface portion of the inter-level dielectric 16 are etched to expose the upper surface of the capacitor plug 17. The silicon oxinitride film 21, which temporarily stops the etching of the inter-level dielectric 22, increases the controllability of the formation of the openings 34.

Figure 10:
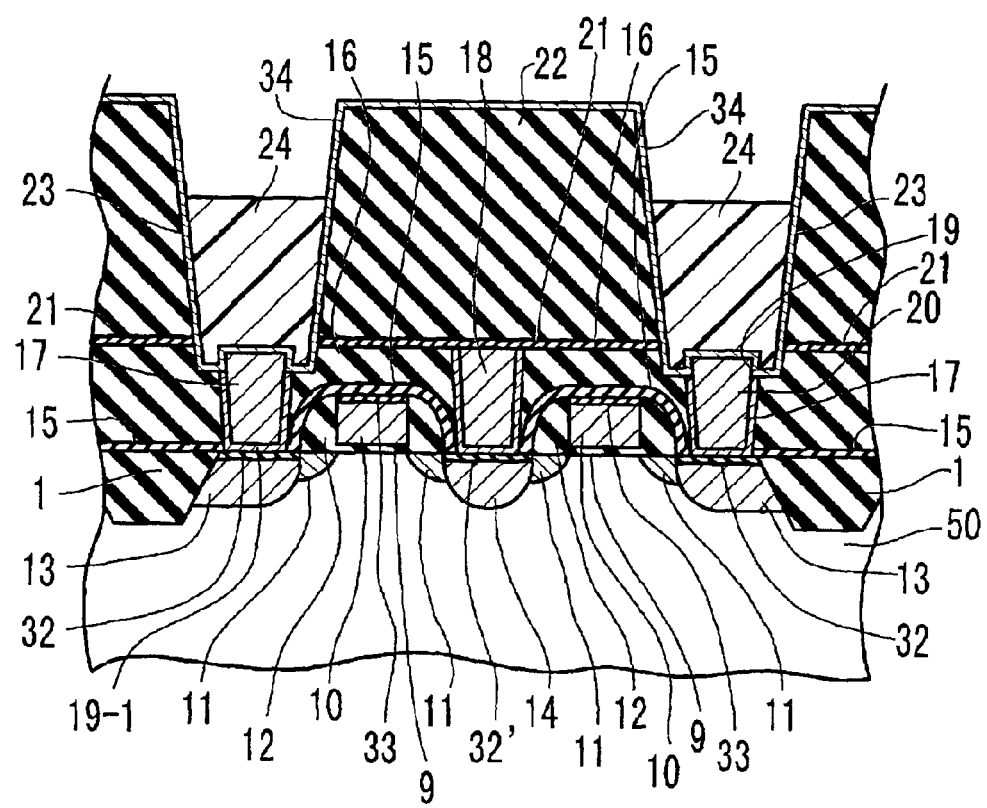
FIG. 10 is a schematic section showing a barrier layer deposited to cover the entire structure, and resist layers which partially plug the openings.

Then, a titanium nitride film having 100 Å for the titanium nitride layer 23 is deposited to cover the entire structure as shown in FIG. 10. Resist layers 24 are then deposited inside the openings 34. The openings 34 are partially plugged with the resist layers 24.

Figure 11:
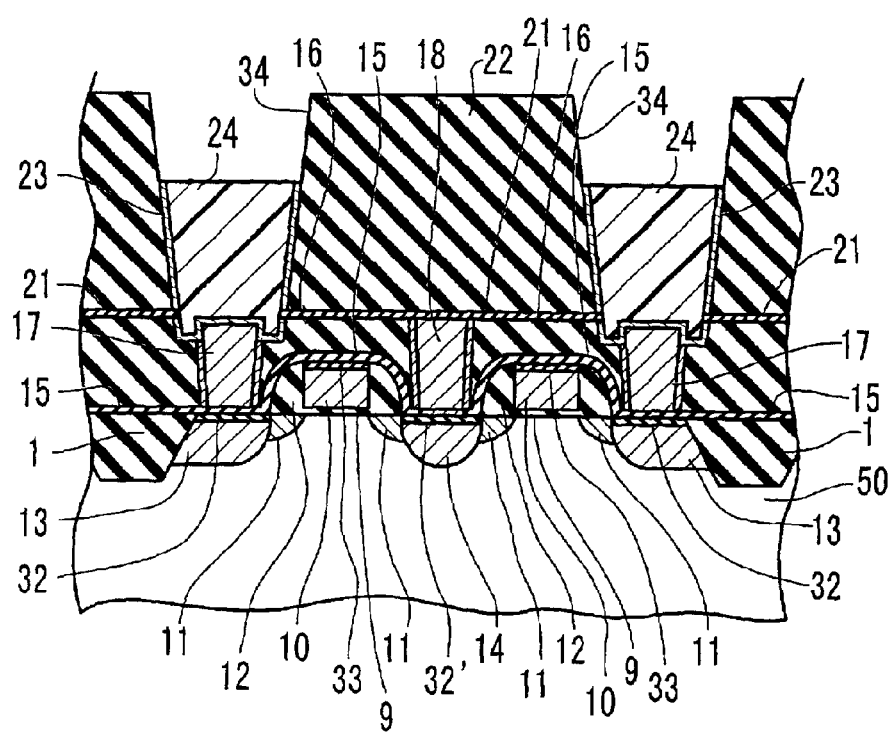
FIG. 11 is a schematic section showing an etching of the barrier layer.

As shown in FIG. 11, the titanium nitride layer 23 is etched back using the resist layers as masks. The titanium nitride layer 23 remains only inside the openings 34.

Figure 12:
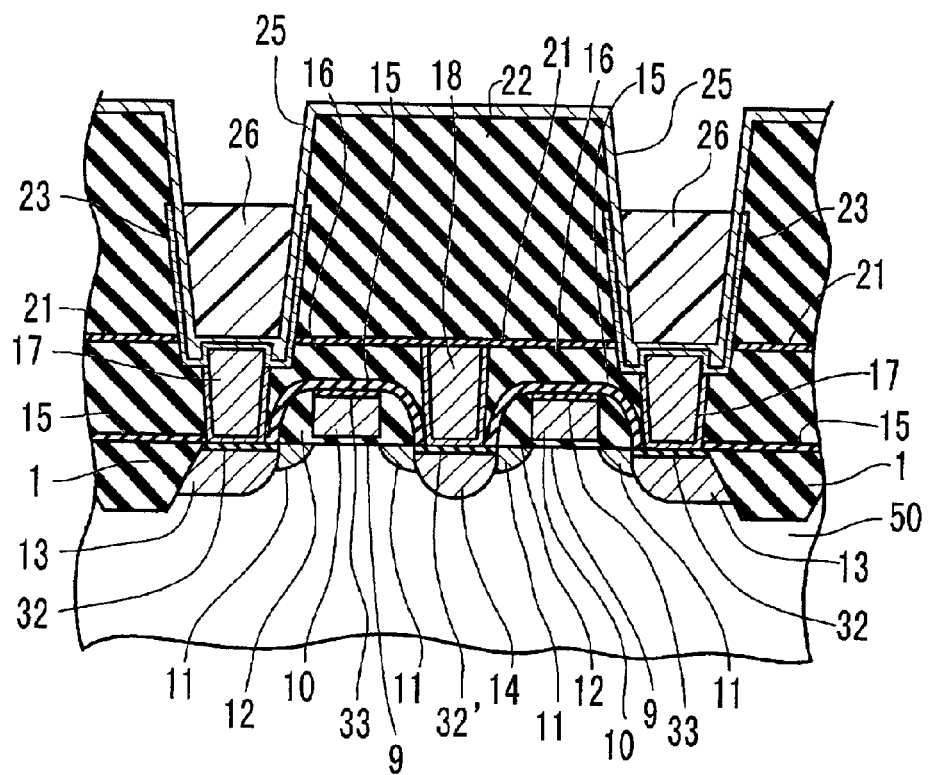
FIG. 12 is a schematic section showing a doped polysilicon film deposited to cover the entire structure, and resist layers which partially plug the openings.

After removing the resist layers 24, a heavily doped amorphous silicon film having a thickness of 550 Å is deposited to cover the entire structure as shown in FIG. 12. The amorphous silicon film is thermally crystallized to form the polysilicon layer 25. During the crystallization, hemisphere grains are formed in the surface portion of the polysilicon layer 25 by an appropriate thermal process. Then, resist layers 26 are deposited inside the openings 34.

Figure 13:
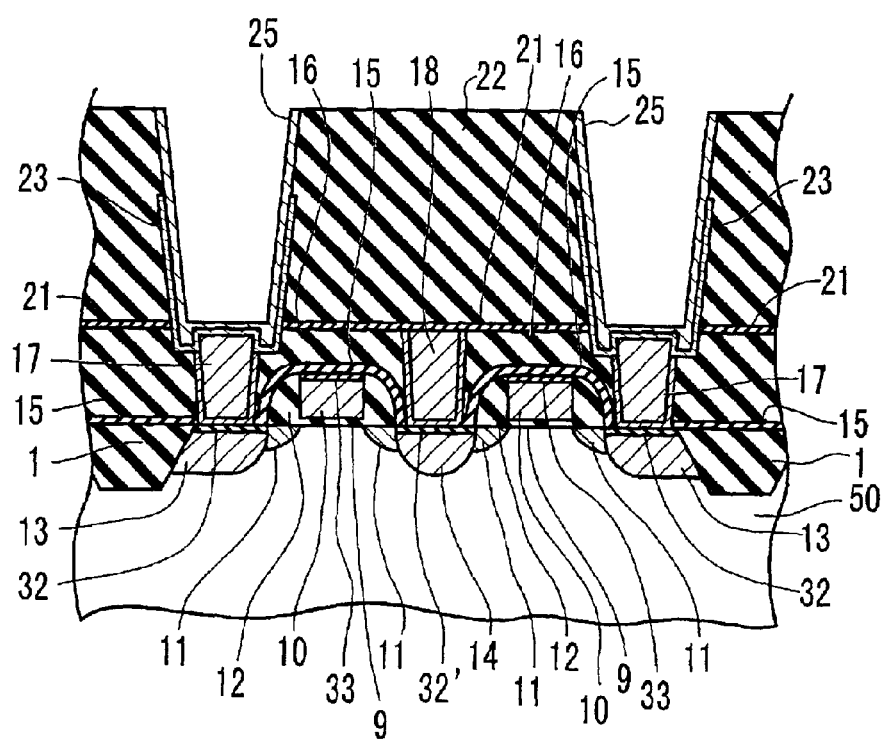
FIG. 13 is a schematic section showing an etching of the doped polysilicon film.

Then, as shown in FIG. 13, the polysilicon layer 25 is etched back using the resist layers 26 as masks. The upper surface portion of the polysilicon layer 25 is removed and the polysilicon layer 25 is left only inside the opening 34. The resist layers 26 are removed to complete the fabrication of the bottom electrode 6, which is constituted by the titanium nitride layer 23 and the polysilicon layer 25.

Figure 14:
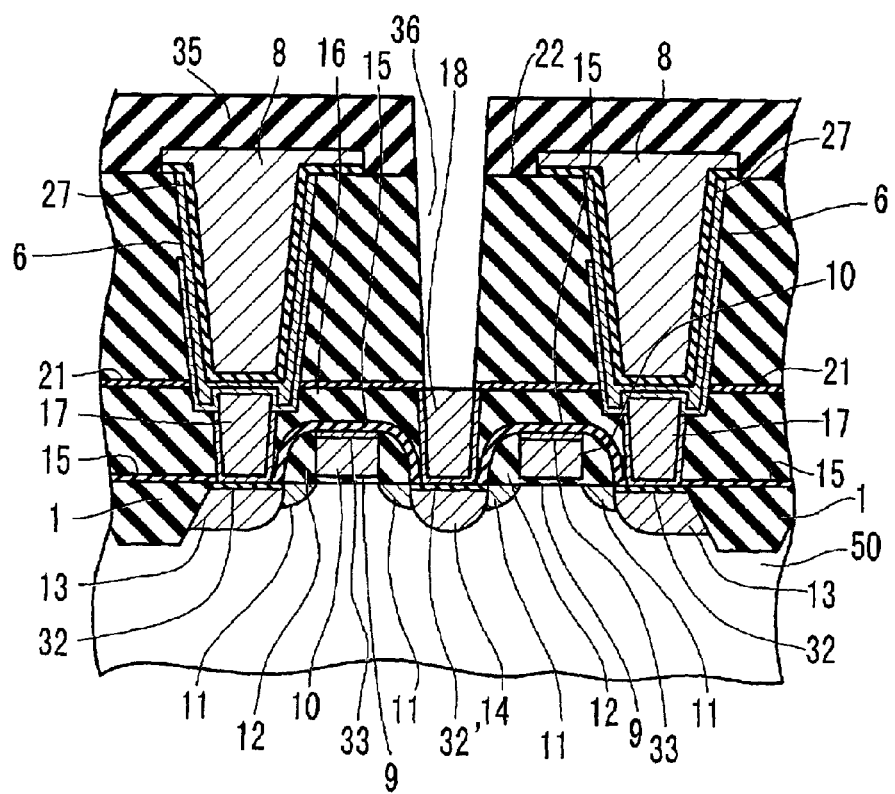
FIG. 14 is a schematic section showing a contact hole formed to expose the buried bit line contact plug.

Then, as shown in FIG. 14, a tantalum oxide film, a titanium nitride film and a doped polysilicon film are successively deposited to cover the entire structure. The deposition of the dielectric layer 27 is achieved by a CVD (Chemical Vapor Deposition) technique. The thicknesses of the tantalum oxide film, the titanium nitride film and the doped polysilicon film are respectively 80 Å, 100 Å, and 1500 Å. Then, the tantalum oxide film, the titanium nitride film and the doped polysilicon film are patterned to form the dielectric layer 27, the titanium nitride layer 28 and the doped polysilicon layer 29. The titanium nitride layer 28 and the doped polysilicon layer 29 constitute the upper electrode 8. The above mentioned processing completes the memory cell capacitors.

Figure 1:
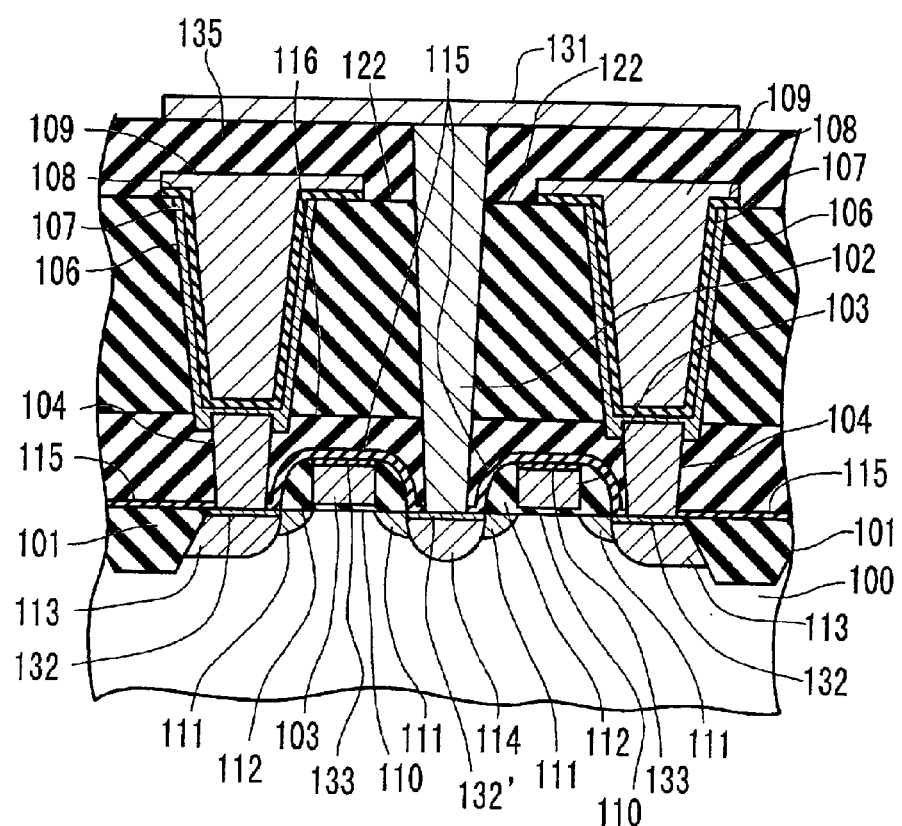
FIG. 1 schematically illustrates a prior art DRAM.

After a deposition of a silicon oxide film for the inter-level dielectric 35 over the memory cell, a contact hole 36 is formed through the inter-level dielectric 35, the inter-level dielectric 22, and the silicon oxinitride film 21 to expose a portion of the buried bit line contact plug 18. The buried bit line contact plug 18 reduces the aspect ratio of the contact hole 36, while the conventional memory device requires the formation of high-aspect-ratio contact hole to expose the drain region 114 of the MOS transistor as shown in FIG. 1. The reduced aspect ratio facilitates the formation of the contact hole 36. The memory device in this embodiment has an advantage of ease of the fabrication process due to the buried bit line contact plug 18.

Figure 15:
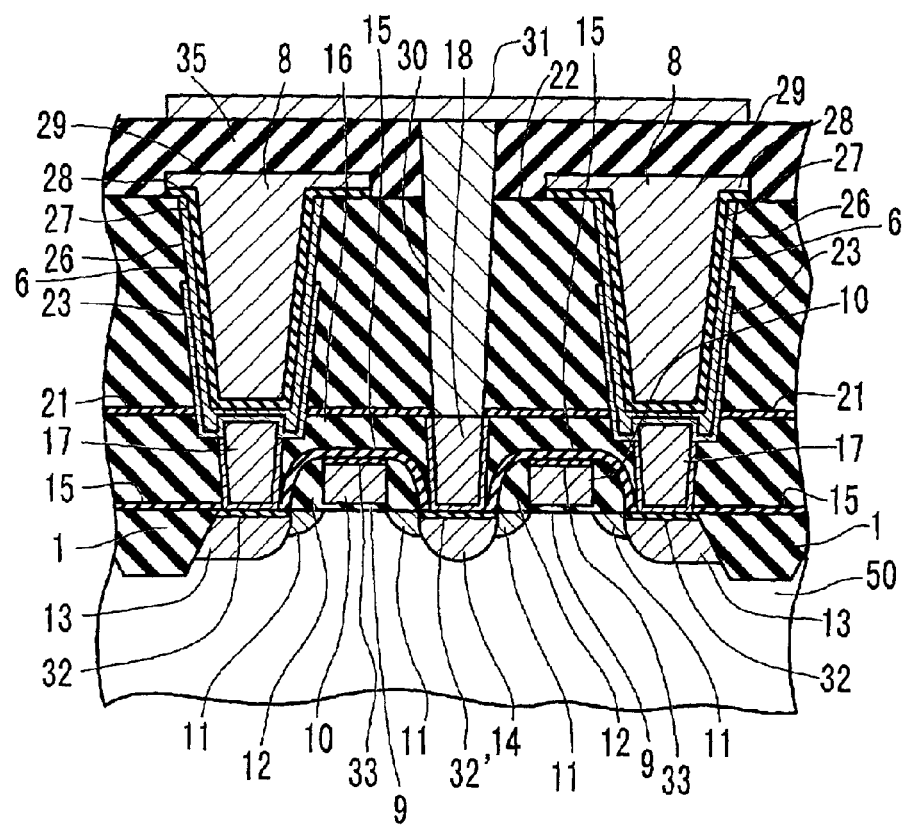
FIG. 15 is a schematic section showing a bit line contact plug and a bit line.

Then, the contact hole 36 is plugged with tungsten to form the bit line contact plug 30 as shown in FIG. 15. Then, the bit line 31 is formed on the inter-level dielectric 35. The electrical connection between the bit line 31 and the drain region 14 is achieved by the bit line contact plug 30, and the buried bit line contact plug 18.

In the first embodiment, the resistance of the capacitor plugs 17 is reduced by the metal layer 20 formed of refractory metal, and this increases the access speed of the memory device.

In addition, the layered structure of the titanium nitride layer 23 and the doped polysilicon layer 25 reduces the resistance of the bottom electrode 6, and thereby further increases the access speed of the memory device.

Furthermore, the memory device in the first embodiment is easy to form the contact between the bit line 31 and the drain region 14 due to the buried bit line contact plug 18. The buried bit line contact plug 18 excludes a fabrication process of forming a high-aspect-ratio contact hole, and thereby facilitates the etching process to form the contact between the bit line 31 and the drain region 14.

Second Embodiment

In a second embodiment, the formation of peripheral logic circuits, such as a low decoder, a column decoder, a controller, and a sensing amplifier, is concurrently executed during the formation of the memory cells.

Figure 16:
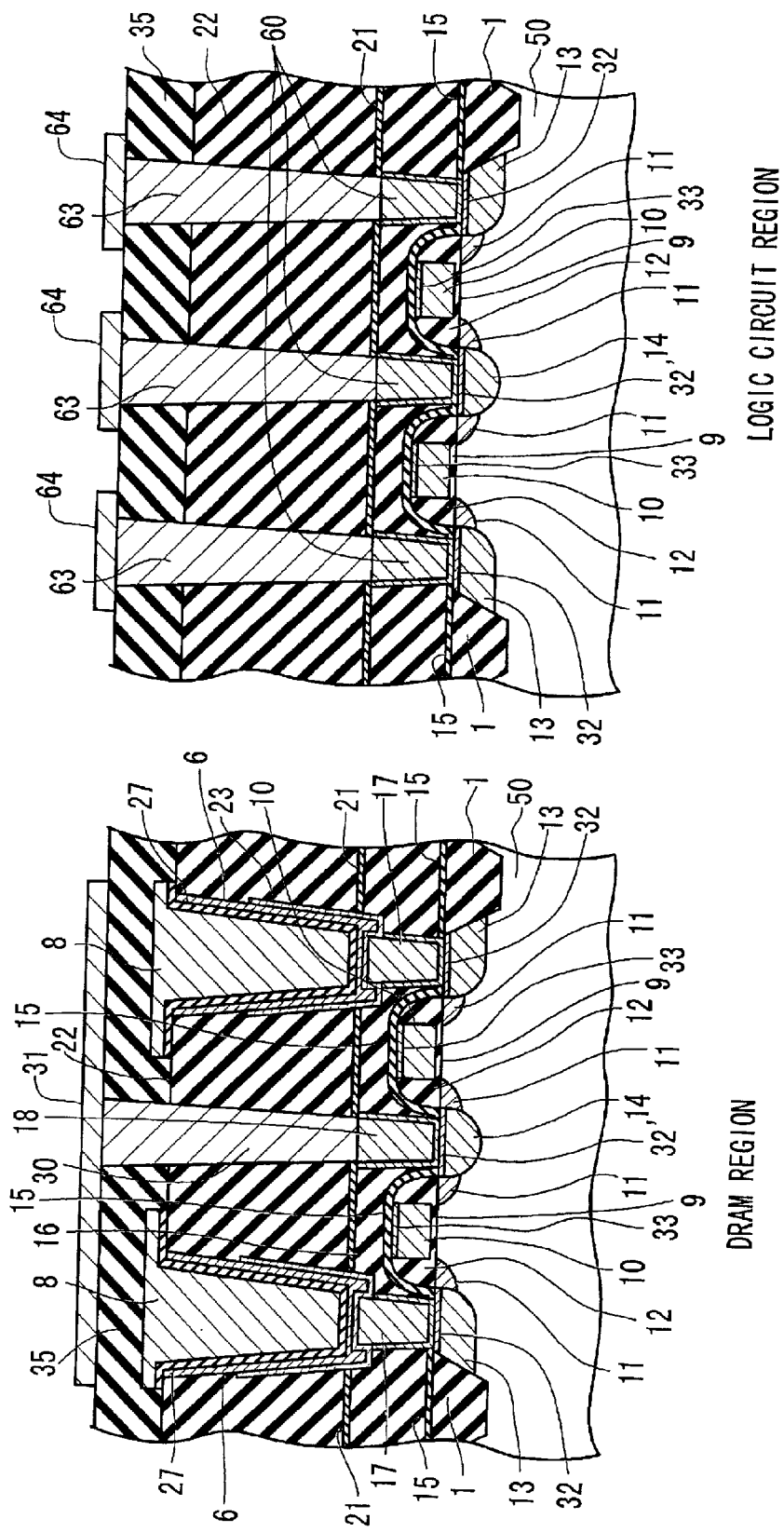
FIG. 16 schematically illustrates a section of a semiconductor memory device in a second embodiment.

As shown in FIG. 16, the memory device in the second embodiment is composed of a DRAM region and a logic circuit region provided on the same silicon substrate 50. The DRAM region accommodates the memory cells, and the logic circuit region accommodates the peripheral logic circuits.

The structure in the DRAM region is identical to that explained in the first embodiment.

The structure in the logic circuit region is as follows. MOS transistors used for the peripheral logic circuits are formed in the surface region of the silicon substrate 50. The MOS transistors in the logic circuit region have the same structure, and are fabricated in the same process as the MOS transistors in the DRAM regions. This is indicated by that the same numerals are used in both of the logic circuit region and the DRAM region in FIG. 17.

The MOS transistors in the logic circuit region are covered with the silicon nitride film 15 and the inter-level dielectric 16. The silicon nitride film 15 and the inter-level dielectric 16 are penetrated by buried contact plugs 60. The inter-level dielectric 16 is covered with the silicon oxinitride film 21, the inter-level dielectric 21, and the inter-level dielectric 35. The silicon oxinitride film 21, the inter-level dielectric 21, and the inter-level dielectric 35 are penetrated by interconnection contact plugs 63. The silicon nitride film 15, the inter-level dielectric 16, the silicon oxinitride film 21, the inter-level dielectric 21, and the inter-level dielectric 35 bridge over to the DRAM region.

Interconnections 64 are formed on the inter-level dielectric 35 in the logic circuit region. The interconnections 64 are electrically connected to the source and drain regions 13, 14 in the logic circuit region through the buried contact plugs 60 and interconnection contact plugs 63. The buried contact plugs 60 has the same structure as the buried contact plugs 18 in the DRAM region, and the both are fabricated in the same steps of the fabrication process. Also, the interconnection contact plugs 63 has the same structure as the bit line contact plug 30 in the DRAM region, and the both are fabricated in the same steps of the fabrication process.

Figure 17:
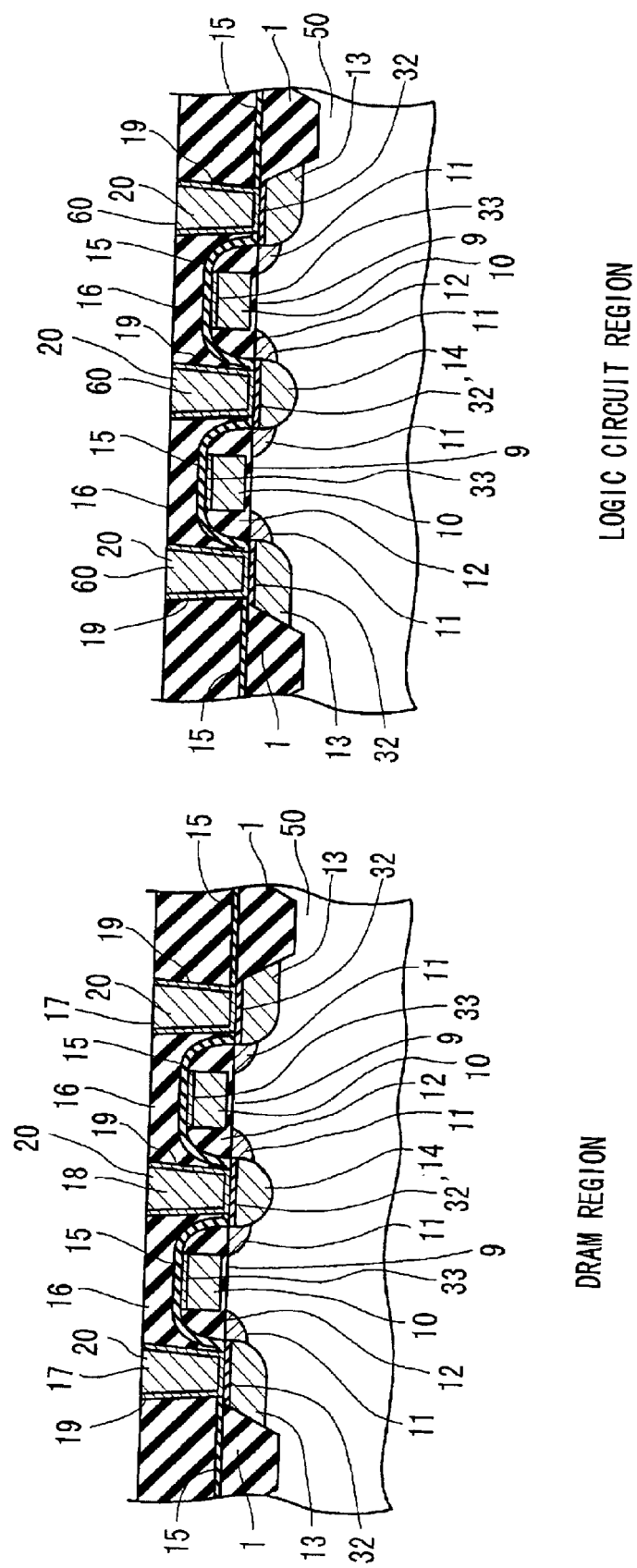
FIG. 17 is a schematic section showing MOS transistors and plugs formed both in the DRAM region and the logic circuit region.
Figure 18:
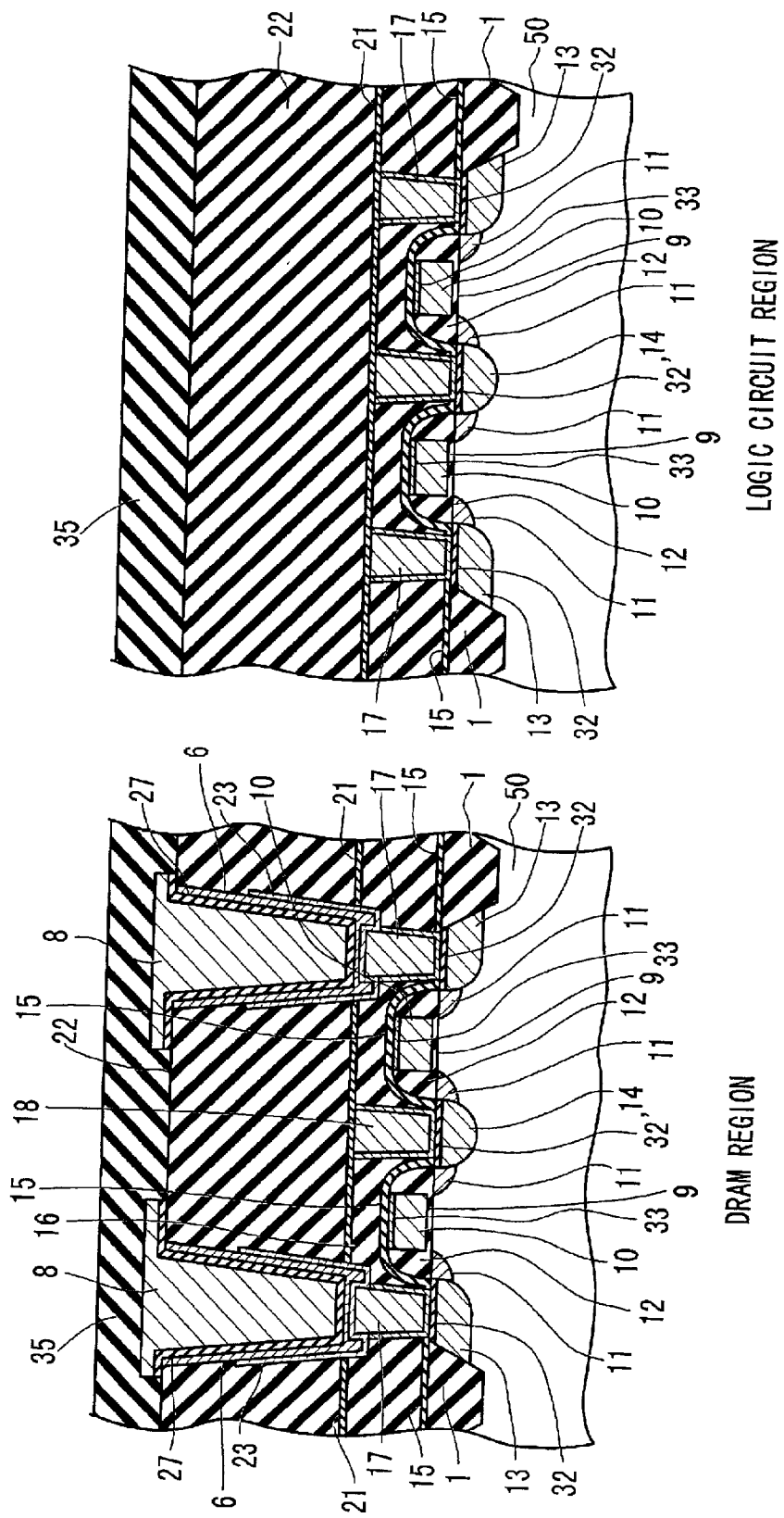
FIG. 18 is a schematic section showing a memory cell capacitor and inter-level dielectrics formed to cover the memory cell capacitor.

FIGS. 17 and 18 shows the fabrication process of the memory device in the second embodiment. The fabrication process begins with formation the MOS transistors in the surface portion of the silicon substrate 50 in both of the DRAM and logic circuit regions. The fabrication process of the MOS transistors is the identical to that in the first embodiment.

After the deposition of the silicon nitride film 15 and the inter-level dielectric 16 over the MOS transistors, the capacitor plugs 17, the buried bit line contact plug 18, and the buried contact plug 60 are concurrently formed in the same fabrication steps. The fabrication of the plugs begins with opening contact holes to expose portions of the source and drain regions 13 and 14 in both of the DRAM and logic circuit region. After a deposition of a titanium nitride film and a refractory metal film, the surface portions of the titanium nitride film and the refractory metal film outside the contact holes are removed by an etch back technique or a CMP technique. The removal of the outside portions completes the capacitor plugs 17, the buried bit line contact plug 18, and the buried contact plugs 60.

Then, as shown in FIG. 18, after the successive deposition of the silicon oxinitride film 21 and the inter-level dielectric 22, the memory cell capacitors, which is respectively constituted by the bottom electrode 6, the dielectric layer 27, and the upper electrode 8, are fabricated inside the inter-level dielectric 22. The fabrication process of the memory cell capacitors is the same as that in the first embodiment. Then, the fabricated memory cell capacitors are covered with the inter-layer dielectric 35. In the meanwhile, the logic circuit region is covered with the silicon oxinitride film 21 and the inter-level dielectric 22, and the inter-level dielectric 35.

Contact holes are then formed through the inter-level dielectric 22, and the inter-level dielectric 35 to reach the buried bit line contact plug 18 and the buried contact plugs 60. The contact holes are plugged with tungsten to form the bit line contact plugs 30 and the interconnection contact plugs 63 at the same fabrication steps. Then, the bit line 31 and the interconnections 64 are formed on the inter-level dielectric 35 at the same fabrication steps. The bit line 31 is electrically connected to the drain region 14 in the DRAM region by the buried bit line contact plug 18 and the bit line contact 30. And the interconnections 64 are electrically connected to the source and drain regions 13 and 14 in the logic circuit region by the buried contact plug 60 and the interconnection contact plugs 63.

In the second embodiment, the capacitor plugs 17, the buried bit line contact plug 18, and the buried contact plugs 60 are buried through the silicon nitride film 15 and the inter-level dielectric 16. This excludes a high-aspect ratio etching process to facilitate the fabrication process of the memory device. In addition, the concurrent formation of the capacitor plugs 17, the buried bit line contact plug 18, and the buried contact plugs 60 improves the efficiency of the fabrication process.

Third Embodiment

Figure 19:
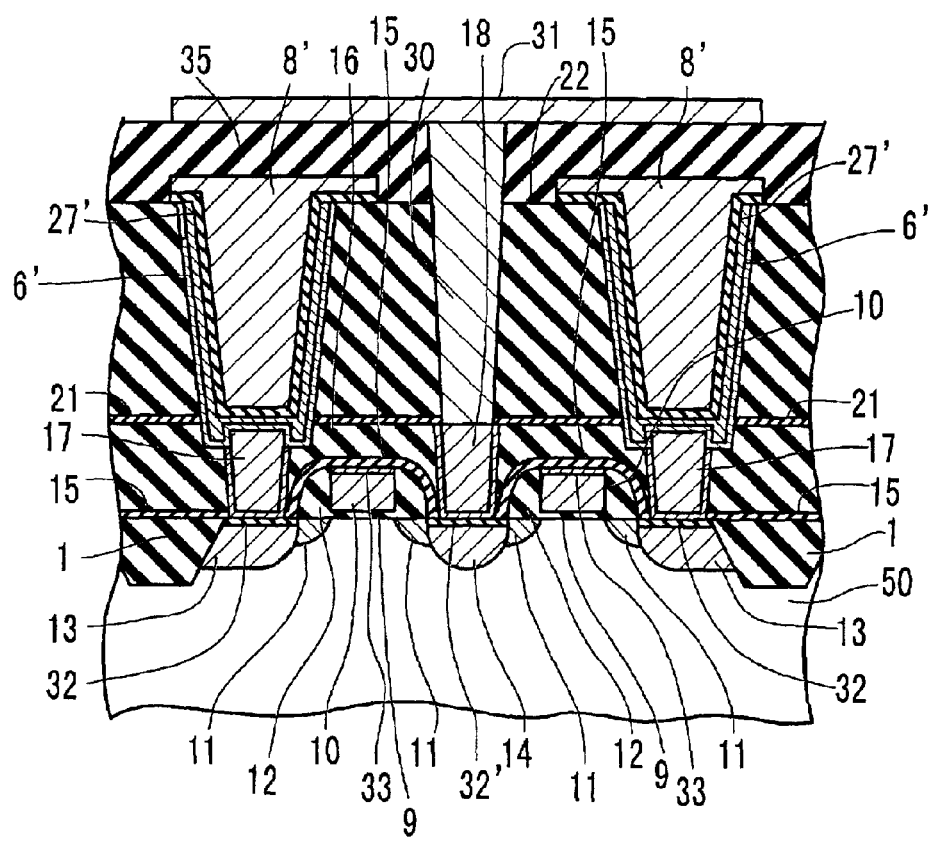
FIG. 19 schematically shows a section of a semiconductor memory device in a third embodiment.

In the third embodiment, the structure and the fabrication process of the memory cell capacitors are modified. As shown in FIG. 19, the memory cells in the third embodiment has the same structure as those in the first embodiment except for that of the memory cell capacitors.

Figure 20:
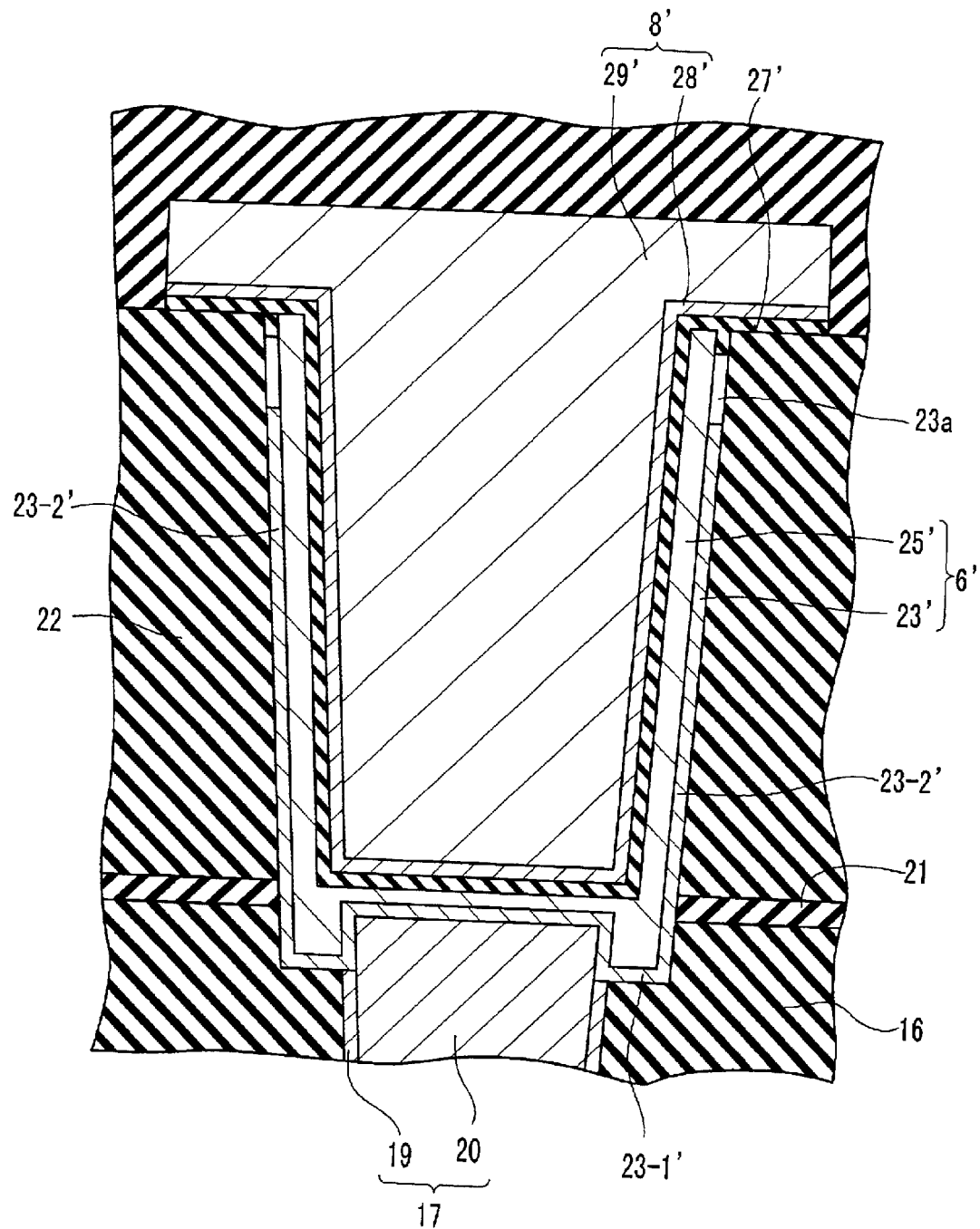
FIG. 20 is an enlarged schematic section of the semiconductor memory device in the third embodiment.

FIG. 20 shows an enlarged schematic section of the memory cell capacitors. In the third embodiment, the memory cell capacitors respectively includes a bottom electrode 6', a dielectric layer 27', and an upper electrode 8'. The bottom electrode 6' includes a titanium nitride layer 23' and a doped polysilicon layer 25'.

The titanium nitride layer 23' is connected to the capacitor plug 17 on the metal layer 20. The titanium nitride layer 23' functions as a barrier layer between the doped polysilicon layer 25' and the metal layer 20.

The titanium nitride layer 23' includes a bottom portion 23-1' formed on the capacitor plug 17, and a side portion 23-2' formed on the side of the hole formed through the inter-level dielectric 22. The side portion 23-2' is connected to the bottom portion 23-1' and extends along the side of the hole toward the upper surface of the inter-level dielectric 22. The side portion 23-2' does not reach the upper surface of the inter-level dielectric 22, which implies that the end of the side portion 23-2' is not aligned to the upper surface of the inter-level dielectric 22.

The doped polysilicon layer 25' is formed on the titanium nitride layer 23'. The doped polysilicon layer 25' does not have a step structure therein, while the doped polysilicon layer 25 in the first embodiment has the step structure caused by the titanium nitride layer 23. The exclusion of the step structure in doped polysilicon layer 25' is achieved by modification of the fabrication process described later. The exclusion of the step structure may cause a small clearance 23a' in the vicinity of the edge of the hole through the inter-level dielectric 22.

The dielectric layer 27' is deposited on the doped polysilicon layer 25'. The dielectric layer 27 is formed of high-∈ material, preferably tantalum oxide. The dielectric layer 27' is formed so as to plug the clearance 23a', however, the clearance 23a' may be not fully plugged as shown in FIG. 20.

The dielectric layer 27' does not have a step structure inside the hole, because of the exclusion of the step structure in doped polysilicon layer 25'. The exclusion of the step structure in the dielectric layer 27' reduces the possibility of short-circuits between the bottom electrode 6' and the upper electrode 8' and thereby improves the reliability of the memory device.

The upper electrode 8' includes a titanium nitride layer 28' and a doped polysilicon layer 29'. The titanium nitride layer 28' is formed on the dielectric layer 27', and the doped polysilicon layer 29' is formed on the titanium nitride layer 28'.

The modified fabrication process of the memory cells in the third embodiment will be described below.

Figure 21:
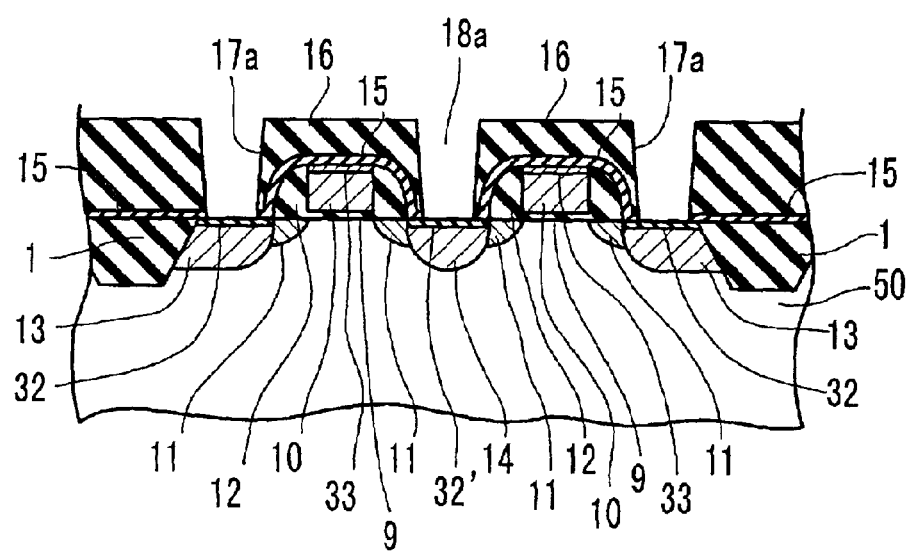
FIG. 21 is a schematic section showing a MOS transistor formed in a surface portion of the substrate, and contact holes formed to expose the source/drain regions of the MOS transistor.
Figure 2:
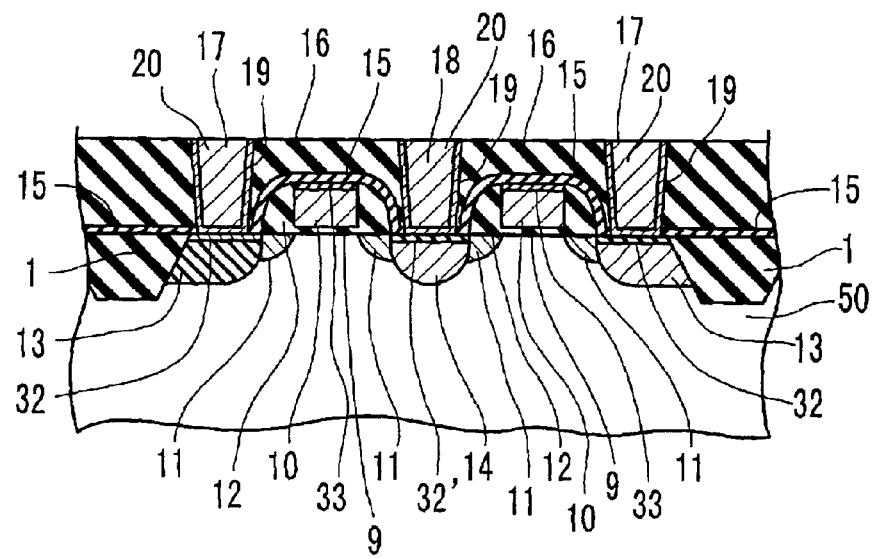
Figure 2:
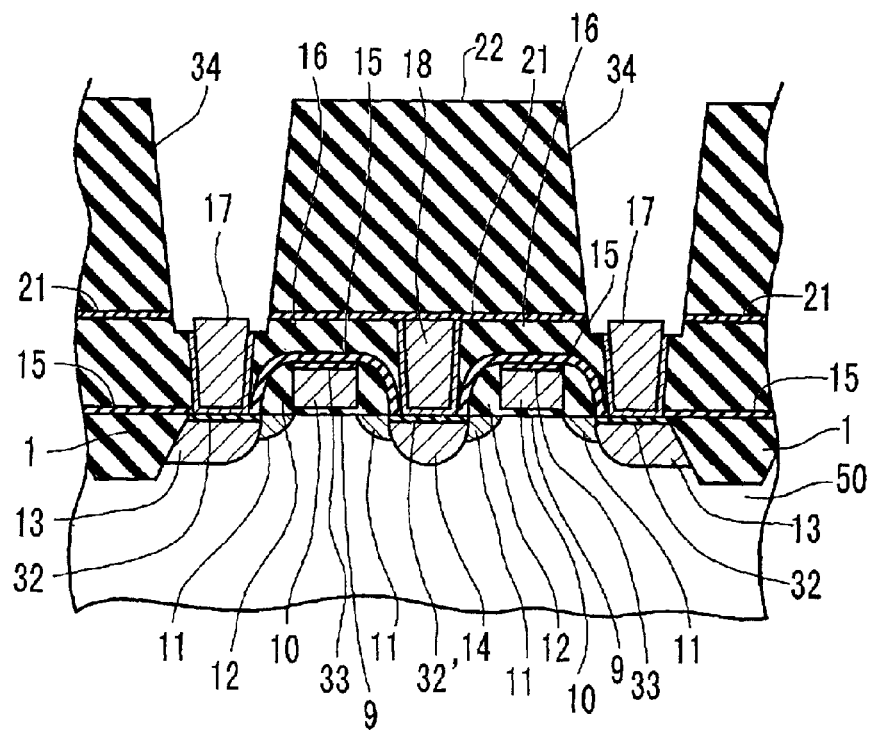

The fabrication process begins with formation of the MOS transistors, as shown in FIG. 21. The MOS transistors are covered with the silicon nitride film 15 and the inter-level dielectric 16. The silicon nitride film 15 and the inter-level dielectric 16 are etched to form contact holes 17a and 18a. The contact holes 17a reach the source regions 13, and the contact hole 18a reaches the drain region 14.

As shown in FIG. 22, the contact holes 17a and 18a are respectively plugged with the capacitor plugs 17 and the buried bit line contact plug 18, which respectively include the barrier layer 19, and the metal layer 20.

After covering the entire structure with the silicon oxinitride film 21 and the inter-level dielectric 22, the silicon oxinitride film 21 and the inter-level dielectric 22 are etched to form openings 34. The openings 34 exposed the upper surfaces of the capacitor plugs 17.

Figure 24:
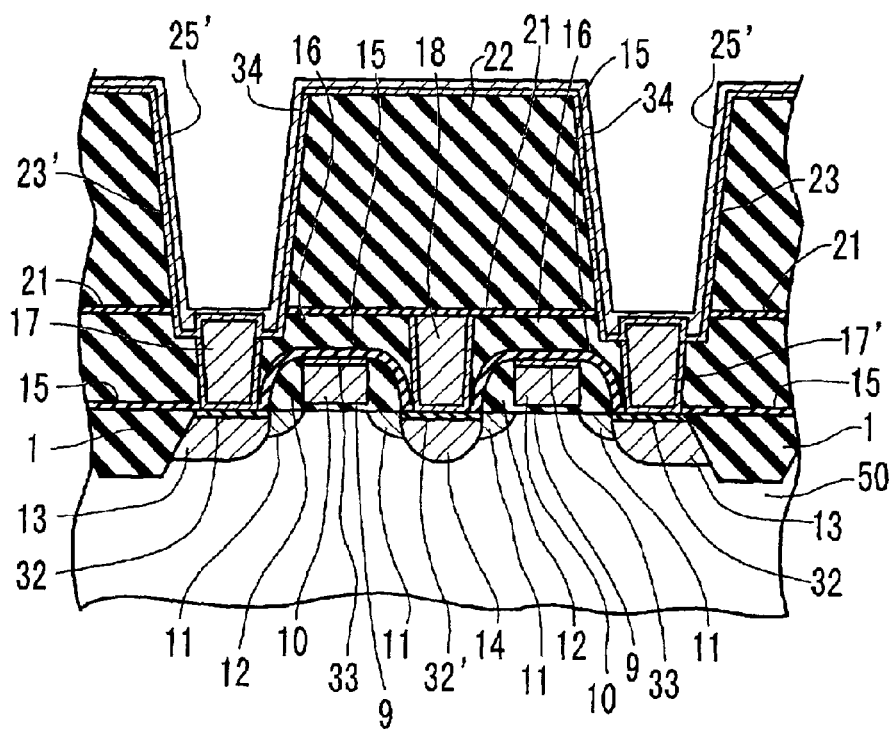
FIG. 24 is a schematic section showing a barrier layer and a polysilicon layer to cover the entire structure.
Figure 25:
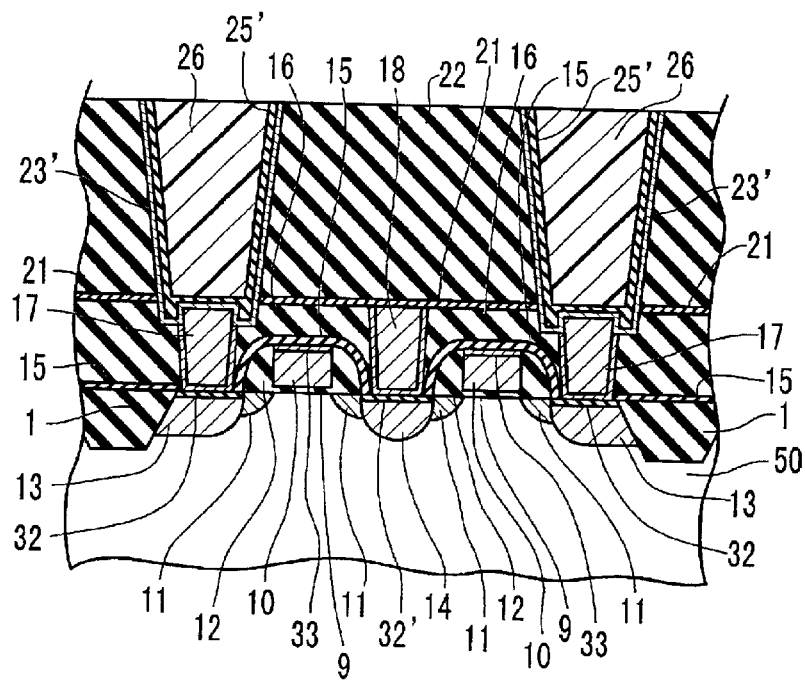
FIG. 25 is a schematic section showing a concurrent etching of the barrier layer and a polysilicon layer.

After etching to form the opening 34, the titanium nitride layer 23' and the doped polysilicon layer 25' are successively deposited to cover the entire structure as shown in FIG. 24. As shown in FIG. 25, after plugging the openings 34 with resist layers 26, the titanium nitride layer 23' and the doped polysilicon layer 25' are then concurrently etched back to remove the upper surface portion thereof outside the openings 34.

Figure 26:
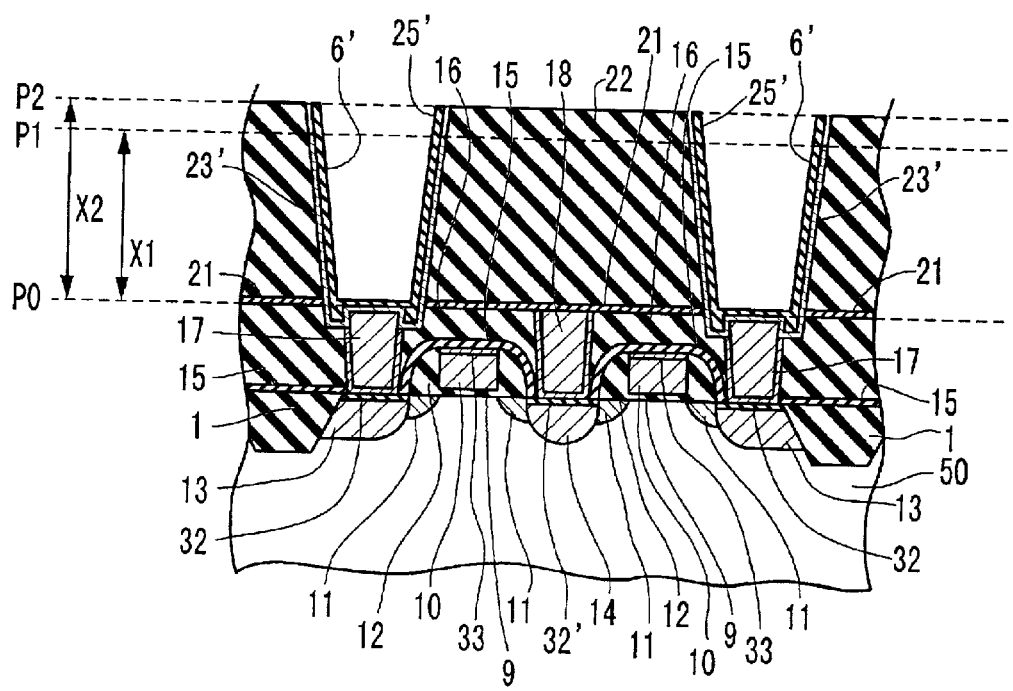
FIG. 26 is a schematic section showing a selective etching of the barrier layer while removing the resist layer used as a mask for the concurrent etching.

The resist layers 26 are then removed by a plasma process as shown in FIG. 26. The removal of the resist layers 26 is executed in an atmosphere including fluorocarbon such as carbon tetrafluoride ($CF_4$).

Figure 27:
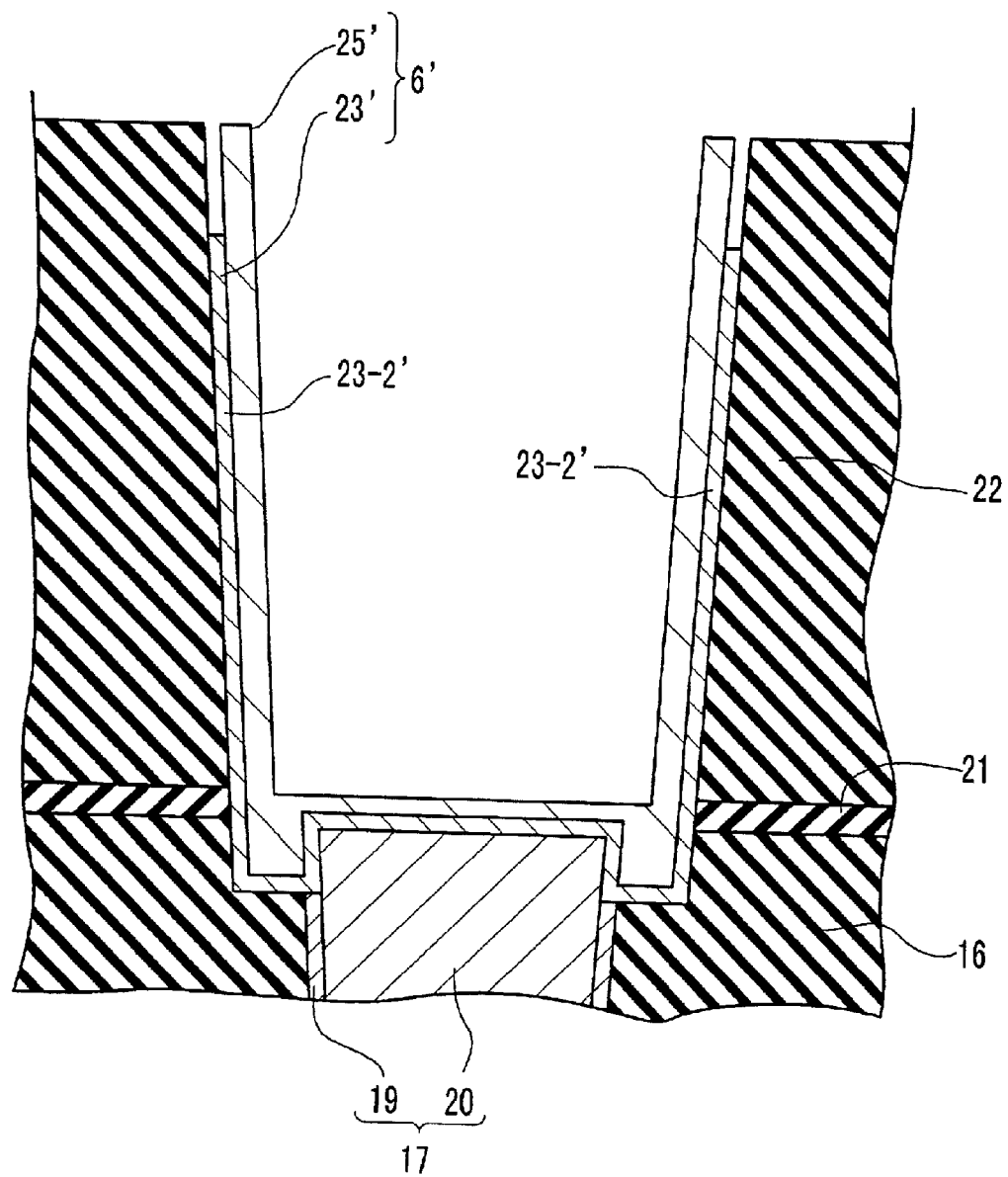
FIG. 27 is a schematic section showing the etched barrier layer.

During the removal of the resist layers 26, portions of the titanium nitride layers 23' is etched in the vicinity of the upper surface of the inter-level dielectric 22 due to the fluorocarbon included in the atmosphere. The etching of the vicinity portions of the titanium nitride layer 23' is selectively executed while the doped polysilicon layer 25' is not etched. Therefore, as shown in FIG. 27, the side portions 23-2' of the titanium nitride layer 23' do not reach the upper surface of the inter-level dielectric 22. The ends of the side portions 23-2' are not aligned with the upper surface of inter-level dielectric 22, while the ends of the doped silicon layer 25' are aligned with it.

Figure 28:
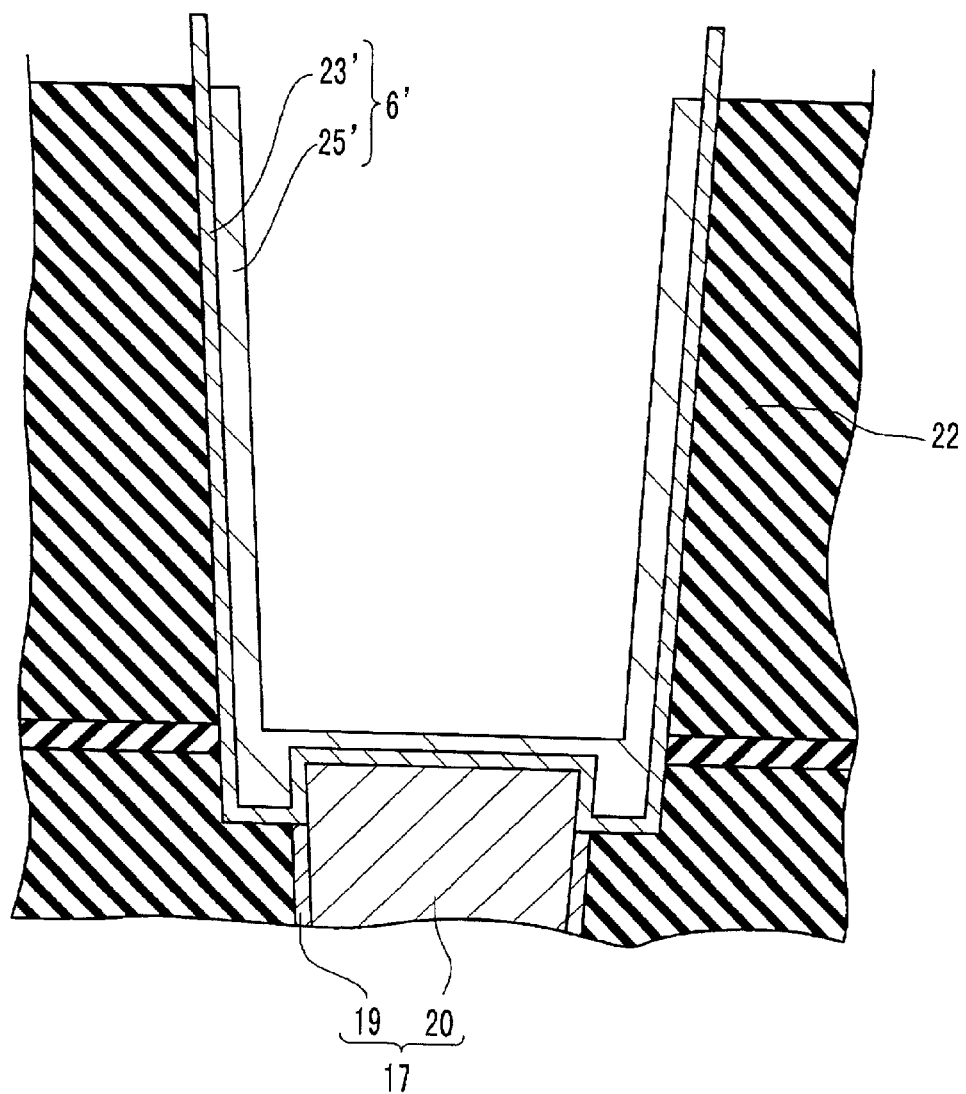
FIG. 28 is a schematic section explaining an advantage of the selective etching of the barrier layer.

The selective etching of the titanium nitride layer 23' effectively prevents short-circuits of the memory cell capacitors. As shown in FIG. 28, the above-mentioned concurrent etching of the titanium nitride layer 23' and the doped polysilicon layer 25' may cause a protrusion of the titanium nitride layer 23' due to the difference in the etching rate between the titanium nitride layer 23' and the doped polysilicon layer 25'. The protrusion of the titanium nitride layer 23' may causes an incomplete deposition of the dielectric layer 27' in the following process. The selective etching of the titanium nitride layer 23' with fluorocarbon removes the protruding portions of the titanium nitride layer 23' and thereby effectively suppresses short-circuits of the memory cell capacitors.

Figure 29:
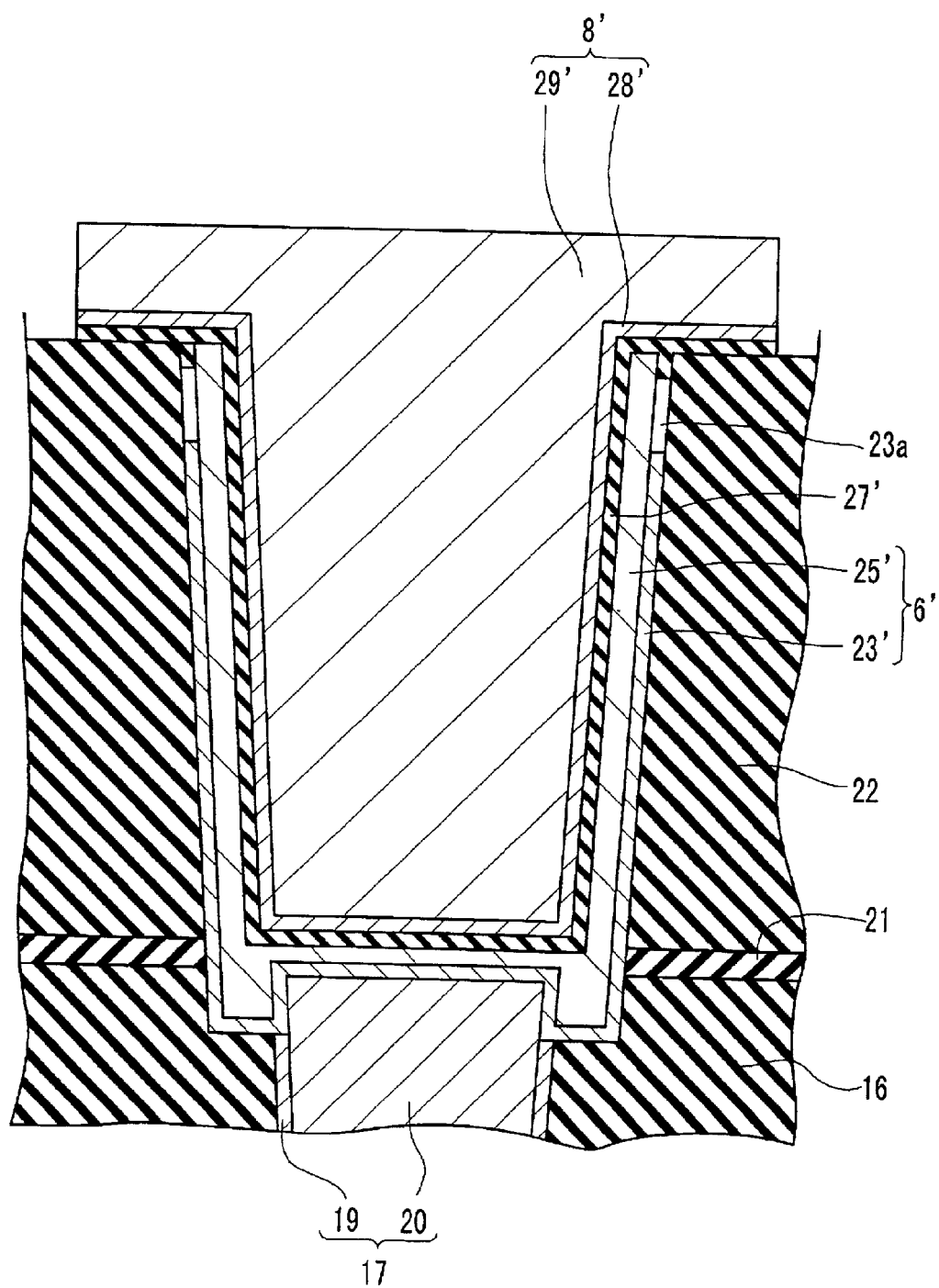
FIG. 29 is a schematic section showing the formed memory cell capacitor.

After the removal of the resist layer 26, a tantalum oxide film, a titanium nitride film and a doped polysilicon film are successively deposited to cover the entire structure as shown in FIG. 29. The deposited tantalum oxide film may not fulfill the space between the inter-level dielectric 22 and the doped polysilicon layer 25' and dispose the void 23a in the vicinity of the upper surface of the inter-level dielectric 22.

The deposited tantalum oxide film, the titanium nitride film, the doped polysilicon film are patterned to form the dielectric layer 27', the titanium nitride layer 28', and the doped polysilicon layer 29'. The titanium nitride layer 28', and the doped polysilicon layer 29' constitutes the upper electrode 8' of the memory cell capacitor.

Figure 30:
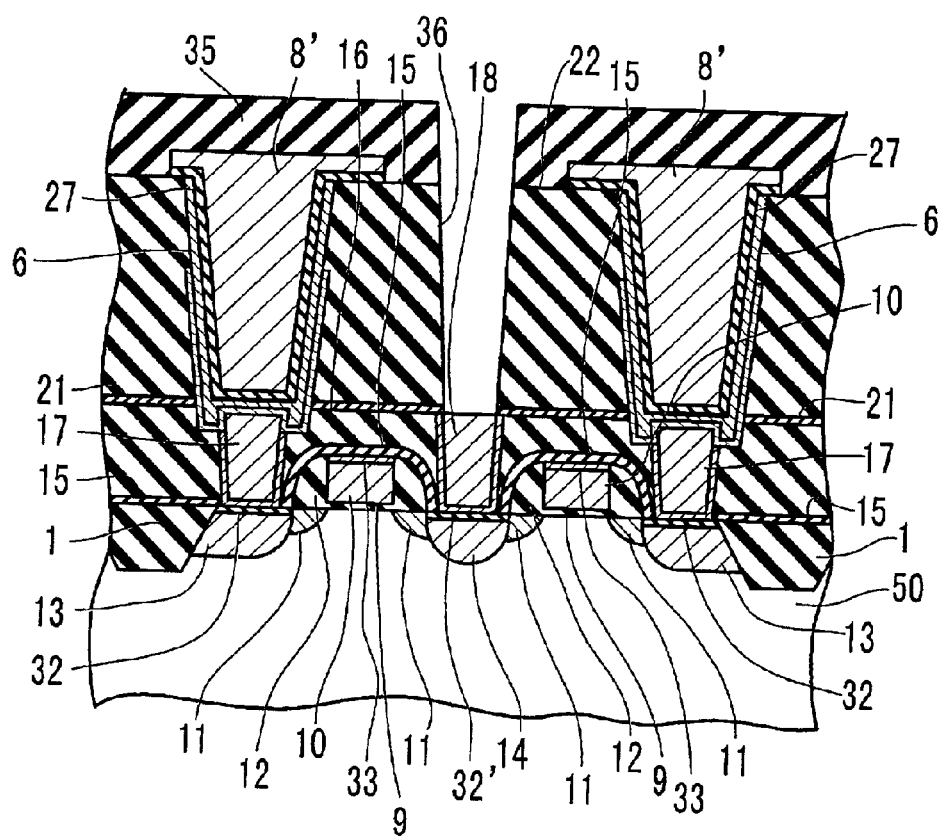
FIG. 30 is a schematic section showing a contact hole formed to expose the buried bit line contact.

After the completion of the memory cell capacitors, the memory cell capacitors are covered with the inter-level dielectric 35 formed of silicon oxide as shown in FIG. 30. The inter-level dielectric 35, the inter-level dielectric 22 and the silicon oxinitride film 21 are then etched to form a contact hole 36 exposing a portion of the buried bit line contact plug 18.

Figure 31:
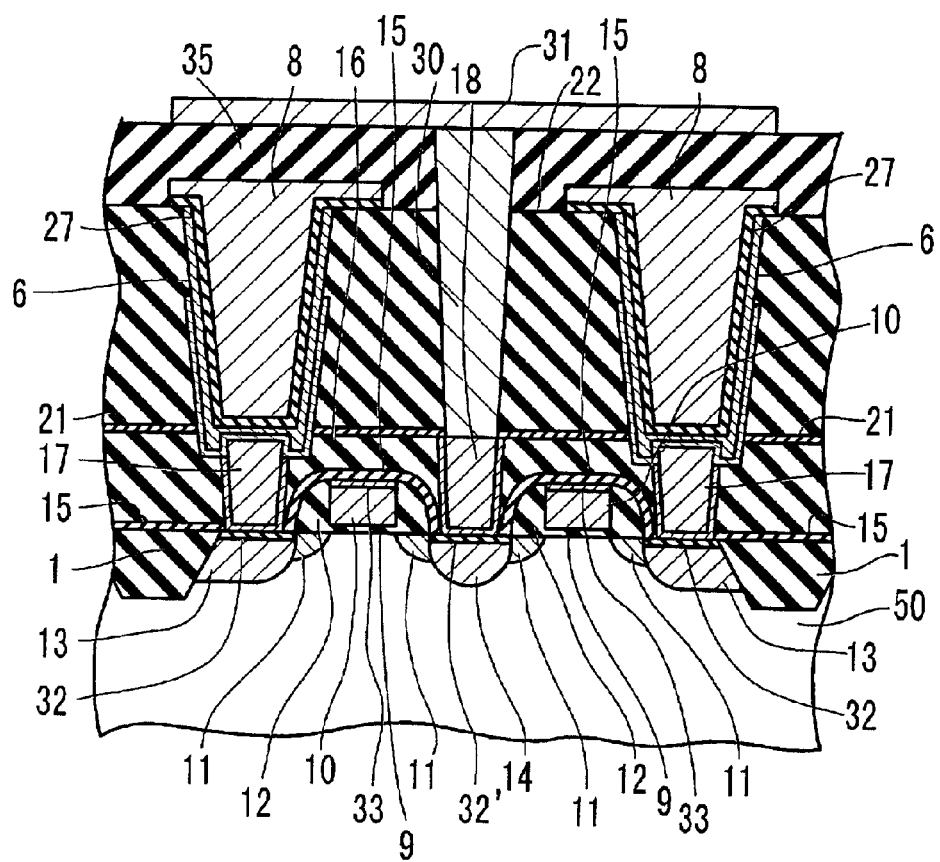
FIG. 31 is a schematic section showing a bit line contact plug and a bit line connected to the bit line contact plug.

Then, the contact hole 36 is plugged with tungsten to form the bit line contact plug 30 as shown in FIG. 31. The bit line 31 is formed on the inter-level dielectric 35 so as to be connected to the bit line contact plug 30. The formation of the bit line 31 completes the memory cells of the semiconductor device.

In the third embodiment, the structure and fabrication process of the memory cell is modified to effectively avoid the protrusions of the titanium nitride layer 23. This prevents short-circuits of the memory cell capacitors and thereby improves the reliability of the semiconductor memory device.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A semiconductor memory device comprising:
   a substrate;
   a MOS (metal oxide semiconductor) transistor formed in a surface portion of said substrate, wherein said MOS transistor includes a source, a gate, and a drain;
   a first inter-level dielectric covering said MOS transistor;
   a capacitor element including:
      a bottom electrode,
      a dielectric layer formed on said bottom electrode, and
      an upper electrode formed on said dielectric layer;
   a first contact formed through said first inter-level dielectric to electrically connect said bottom electrode to said source, wherein said first contact includes a first metal portion formed of metal;
   a second contact formed through said first inter-level dielectric to be connected to said drain, wherein said second contact includes a second metal portion formed of said metal,
   wherein said bottom electrode comprises a polysilicon layer connected to said dielectric layer, and an electrode barrier layer formed between said first metal portion and said polysilicon layer; and
   a second inter-level dielectric covering said first inter-level dielectric, wherein a hole is formed through said second inter-level dielectric,
   wherein said electrode barrier layer includes:
   a bottom barrier portion formed on said metal portion of said first contact, and
   a side barrier portion connected to said bottom barrier portion, said side barrier portion being formed on a side surface of said hole to extend towards an upper surface of said second inter-level dielectric,
   wherein said polysilicon layer includes:
   a bottom electrode portion formed on said bottom barrier portion, and
   a side electrode portion connected to said bottom electrode portion, said side electrode portion being formed on said side barrier portion, and
   wherein an end of said side electrode portion is substantially in alignment with said upper surface of said second inter-level dielectric, while an end of said side barrier portion is out of alignment with said upper surface of said second inter-level dielectric, said side barrier portion not reaching said upper surface of said second inter-level dielectric.

2. The semiconductor memory device according to claim 1, wherein said metal is a refractory metal, and said first contact further includes a barrier layer formed between said source and said first metal portion.

3. The semiconductor memory device according to claim 2, wherein said refractory metal is tungsten, and said barrier layer is formed of titanium nitride.

4. The semiconductor memory device according to claim 3, wherein said bottom electrode includes:

a polysilicon layer connected to said dielectric layer, and an electrode barrier layer formed between said first metal portion and said polysilicon layer.

5. The semiconductor memory device according to claim 1, wherein said metal is tungsten, and said second contact further includes a second barrier layer formed of titanium nitride between said drain and said second metal portion.

6. The semiconductor memory device according to claim 1, further comprising:

a second inter-level dielectric covering said capacitor element and said first inter-level dielectric;

a third contact formed through said second inter-level dielectric; and a bit line formed on said second inter-level dielectric, wherein said second and third contact electrically connect said drain to said bit line.

7. The semiconductor memory device according to claim 6, further comprising:

another MOS transistor provided in a surface portion of said substrate for a peripheral circuit;

a fourth contact formed through said first inter-level dielectric to be connected to said another MOS transistor on a source/drain thereof;

a fifth contact formed through said second inter-level dielectric to be connected to said fourth contact, wherein said fourth contact includes a third metal portion formed of said metal.

8. The semiconductor memory device according to claim 1, wherein said electrode barrier layer is formed of titanium nitride.

9. A semiconductor memory device, comprising:

a substrate;

a transistor in a surface of said substrate, said transistor having a source, drain, and gate;

a first inter-level dielectric on said transistor;

a second inter-level dielectric on said first inter-level dielectric;

a capacitor element that extends through said second inter-level dielectric, said capacitor element having bottom and top electrodes and a capacitor dielectric therebetween;

a bit line contact plug that extends through said second inter-level dielectric;

a first contact through said first inter-level dielectric that connects said bottom electrode of said capacitor element to said source of said transistor;

a second contact through said first inter-level dielectric that connects said bit line contact plug to said drain of said transistor, wherein said first and second contacts and said bit line contact plug are all formed of a same first metal; and a barrier layer between said bottom electrode of said capacitor element and said second inter-level dielectric, said barrier layer extending only partially along said capacitor element so that a portion of said bottom electrode directly contacts said second inter-level dielectric.

10. The device of claim 9, wherein the first metal is tungsten.

* * * * *